(12) United States Patent
Britt et al.

(10) Patent No.: US 9,515,055 B2
(45) Date of Patent: Dec. 6, 2016

(54) LIGHT EMITTING DEVICES INCLUDING MULTIPLE ANODES AND CATHODES

(75) Inventors: Jeffrey Carl Britt, Cary, NC (US); Michael P. Laughner, Cary, NC (US); Brandon Stanton, Raleigh, NC (US)

(73) Assignee: Cree, Inc., Durham, NC (US)

( * ) Notice: Subject to any disclaimer, the term of this patent is extended or adjusted under 35 U.S.C. 154(b) by 699 days.

(21) Appl. No.: 13/471,164

(22) Filed: May 14, 2012
(Under 37 CFR 1.47)

(65) Prior Publication Data
US 2013/0301257 A1  Nov. 14, 2013

(51) Int. Cl.
*F21V 9/00* (2015.01)
*H01L 25/075* (2006.01)
*H01L 33/48* (2010.01)
*H01L 33/62* (2010.01)

(52) U.S. Cl.
CPC ......... *H01L 25/0753* (2013.01); *H01L 33/486* (2013.01); *H01L 33/62* (2013.01); *H01L 2224/48091* (2013.01); *H01L 2224/48465* (2013.01); *H01L 2224/49175* (2013.01); *H01L 2924/12044* (2013.01)

(58) Field of Classification Search
CPC ..... H01L 25/0753; H01L 33/62; H01L 33/486
USPC ................ 257/88; 362/231, 235, 249.02
See application file for complete search history.

(56) References Cited

U.S. PATENT DOCUMENTS

| 7,095,056 B2 | 8/2006 | Vitta et al. |
| 7,213,940 B1 | 5/2007 | Negley et al. |
| D615,504 S | 5/2010 | Keller |
| D628,965 S | 12/2010 | Kuwaharada et al. |
| D628,966 S | 12/2010 | Kuwaharada et al. |
| D631,020 S | 1/2011 | Chuang et al. |
| D636,741 S | 4/2011 | Kuwaharada et al. |
| D640,643 S | 6/2011 | Hsieh |
| D642,141 S | 7/2011 | Kuwaharada et al. |

(Continued)

FOREIGN PATENT DOCUMENTS

| JP | 2001-291406 A | 10/2001 |
| JP | 2003-204081 A | 7/2003 |

(Continued)

OTHER PUBLICATIONS

Unpublished Design U.S. Appl. No. 29/420,874, filed May 14, 2012.

(Continued)

*Primary Examiner* — Hrayr A Sayadian
(74) *Attorney, Agent, or Firm* — Withrow & Terranova, P.L.L.C.; Vincent K. Gustafson

(57) ABSTRACT

Solid state (e.g., LED) lighting devices include multiple emitters mounted on or over a substrate comprising insulating material with conductive traces thereon, with various emitters being independently controllable with multiple pairs of anodes and cathodes that may be arranged on an opposite surface of the substrate than the emitters. Electrically conductive vias may be defined through the insulating substrate, and a molded lens may be provided over the substrate and emitters mounted thereon. Various combinations of independently controllable emitters or emitter groups may be provided, for example, a red emitter in combination with multiple blue shifted yellow (BSY) emitters, or separately controllable red, green, blue, and white (e.g., BSY) emitters.

34 Claims, 12 Drawing Sheets

(56) References Cited

U.S. PATENT DOCUMENTS

| | | |
|---|---|---|
| D642,142 S | 7/2011 | Kuwaharada et al. |
| D642,143 S | 7/2011 | Kuwaharada et al. |
| D643,381 S | 8/2011 | Hsieh |
| D645,416 S | 9/2011 | Kuwaharada et al. |
| D645,419 S | 9/2011 | Kuwaharada et al. |
| D645,420 S | 9/2011 | Kuwaharada et al. |
| D646,645 S | 10/2011 | Chen et al. |
| D649,943 S | 12/2011 | Kuwaharada et al. |
| D649,944 S | 12/2011 | Kuwaharada et al. |
| D650,341 S | 12/2011 | Kuwaharada et al. |
| D650,342 S | 12/2011 | Kuwaharada et al. |
| D650,343 S | 12/2011 | Andrews et al. |
| D658,139 S | 4/2012 | Andrews et al. |
| D660,257 S | 5/2012 | Andrews et al. |
| D674,758 S | 1/2013 | Wu et al. |
| D675,169 S | 1/2013 | Chou |
| 8,378,375 B2 | 2/2013 | Lee |
| 2008/0054286 A1 | 3/2008 | Loh et al. |
| 2008/0179618 A1 | 7/2008 | Cheng |
| 2009/0050907 A1 | 2/2009 | Yuan et al. |
| 2009/0108281 A1 | 4/2009 | Keller |
| 2010/0110659 A1 | 5/2010 | Nakajima |
| 2010/0140633 A1 | 6/2010 | Emerson |
| 2010/0140634 A1 | 6/2010 | van de Ven et al. |
| 2010/0176751 A1 | 7/2010 | Oshio et al. |
| 2010/0244740 A1 | 9/2010 | Alpert et al. |
| 2010/0252851 A1 | 10/2010 | Emerson |
| 2010/0270567 A1 | 10/2010 | Emerson |
| 2011/0062482 A1 | 3/2011 | Solomensky et al. |
| 2011/0121323 A1 | 5/2011 | Wu et al. |
| 2011/0127912 A1 | 6/2011 | Lee et al. |
| 2011/0220920 A1 | 9/2011 | Collins |
| 2011/0248289 A1 | 10/2011 | Hsieh et al. |
| 2012/0069564 A1 | 3/2012 | Andrews |
| 2012/0086024 A1 | 4/2012 | Andrews |
| 2012/0104426 A1 | 5/2012 | Chan et al. |
| 2012/0199852 A1 | 8/2012 | Lowes et al. |
| 2012/0286304 A1 | 11/2012 | LeToquin et al. |
| 2013/0092960 A1 | 4/2013 | Wilcox et al. |
| 2013/0105835 A1 | 5/2013 | Wu et al. |

FOREIGN PATENT DOCUMENTS

| | | |
|---|---|---|
| JP | 2007173557 A | 7/2007 |
| JP | 2010-103404 A | 5/2010 |

OTHER PUBLICATIONS

Ex parte Quayle Action for U.S. Appl. No. 29/420,874 mailed Dec. 27, 2013, 5 pages.

Notice of Allowance for U.S. Appl. No. 29/420,874 mailed Apr. 23, 2014, 8 pages.

Unpublished Design U.S. Appl. No. 29/420,876, filed May 14, 2012.

Non-final Office Action for U.S. Appl. No. 29/420,876 mailed Dec. 31, 2013, 6 pages.

Notice of Allowance for U.S. Appl. No. 29/420,876 mailed May 7, 2014, 8 pages.

Ex parte Quayle Action for U.S. Appl. No. 29/430,291 mailed Dec. 19, 2013, 5 pages.

Notice of Allowance for U.S. Appl. No. 20/430,291 mailed Apr. 9, 2014, 7 pages.

"Optimizing PCB Thermal Performance for Cree® XLamp® LEDs". Technical Article. pp. 1-21. CLD-AP37 Rev 2B. Cree, Inc. Durham, North Carolina.

"Cree® XLamp® MC-E LED". Product Family Data Sheet. pp. 1-14. CLD-DS16 Rev 8A. Cree, Inc. Durham, North Carolina.

"Cree® XLamp® ML-C LEDs". Product Family Data Sheet. pp. 1-13. CLD-DS46 Rev 0A. Cree, Inc. Durham, North Carolina.

"Cree® XLamp® MP-L EasyWhite™ LEDs". Product Family Data Sheet/Binning and Labeling Document. pp. 1-14. CLD-DS26 Rev 4. Cree, Inc. Durham, North Carolina.

"Cree® XLamp® MT-G EasyWhite™ LEDs". Product Family Data Sheet/Binning and Labeling Document. pp. 1-16. CLD-DS36 Rev 4A. Cree, Inc. Durham, North Carolina.

"Cree® XLamp® XM-L EasyWhite™ LEDs". Product Family Data Sheet. pp. 1-17. CLD-DS38 Rev 1A. Cree, Inc. Durham, North Carolina.

"Cree® XLamp® XM-L HVW LEDs". Product Family Data Sheet. pp. 1-9. CLD-DS44 rev 2. Cree, Inc. Durham, North Carolina.

"Cree® XLamp® XT-E LEDs". Product Family Data Sheet. pp. 1-15. CLD-DS41 Rev 2B. Cree, Inc. Durham, North Carolina.

"Cree® XLamp® XT-E HVW LEDs". Product Family Data Sheet. pp. 1-9. CLD-DS43 Rev 2A. Cree, Inc. Durham, North Carolina.

International Search Report and Written Opinion corresponding to International Patent Application No. PCT/US2013/038321 dated Aug. 27, 2013.

International Preliminary Report on Patentability for International Patent Application No. PCT/US2013/038321 mailed Nov. 27, 2014, 16 pages.

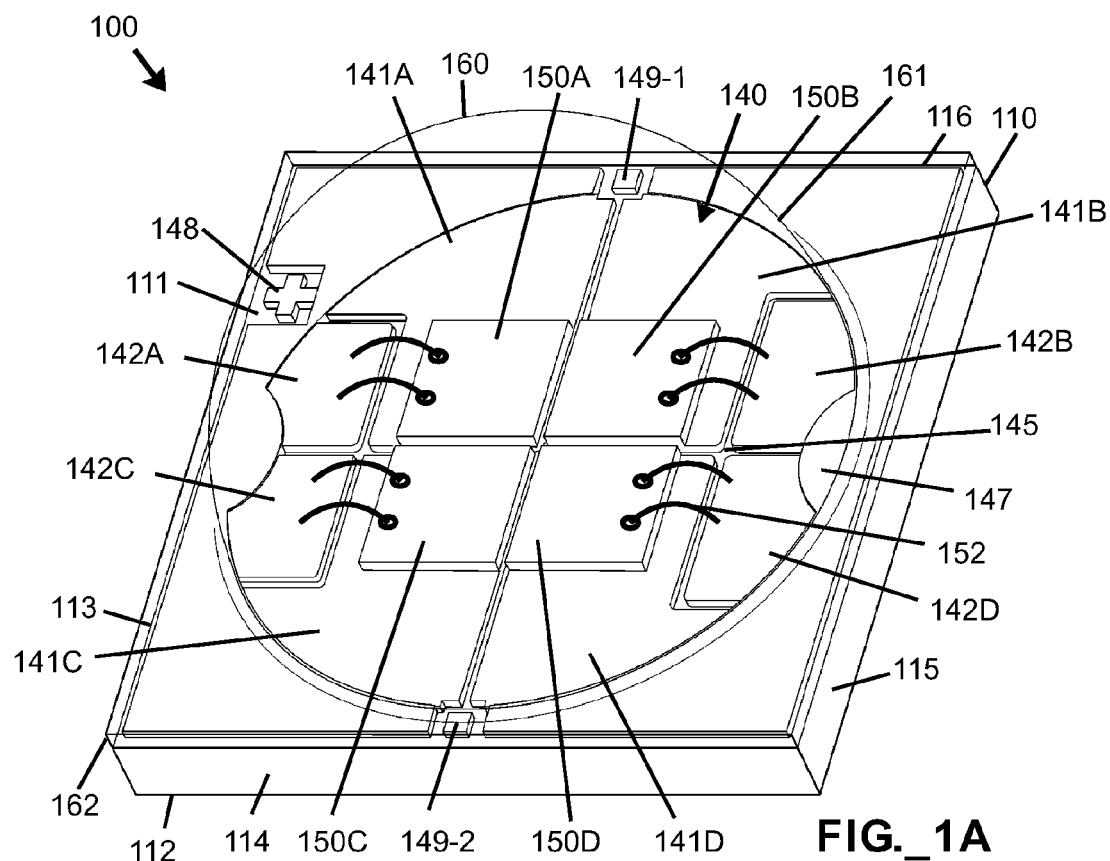
FIG._1A
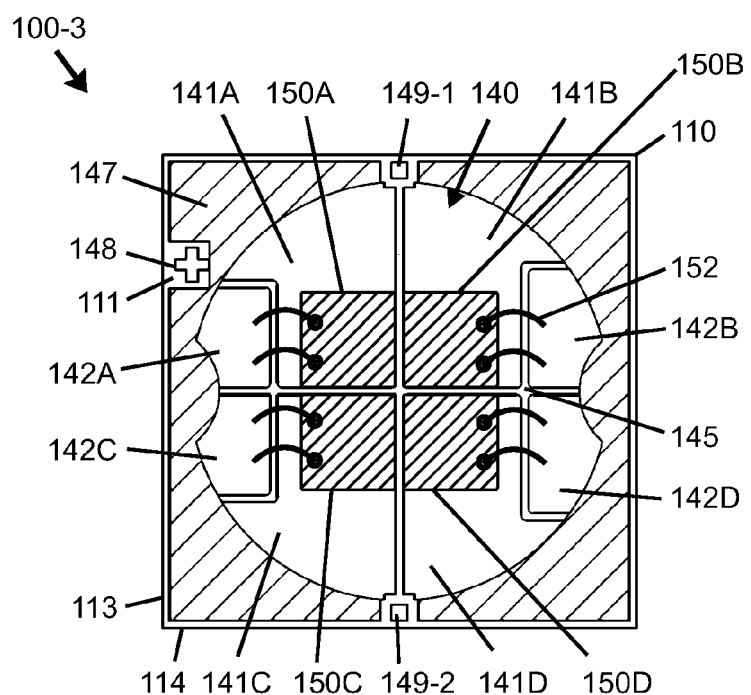
FIG._1B

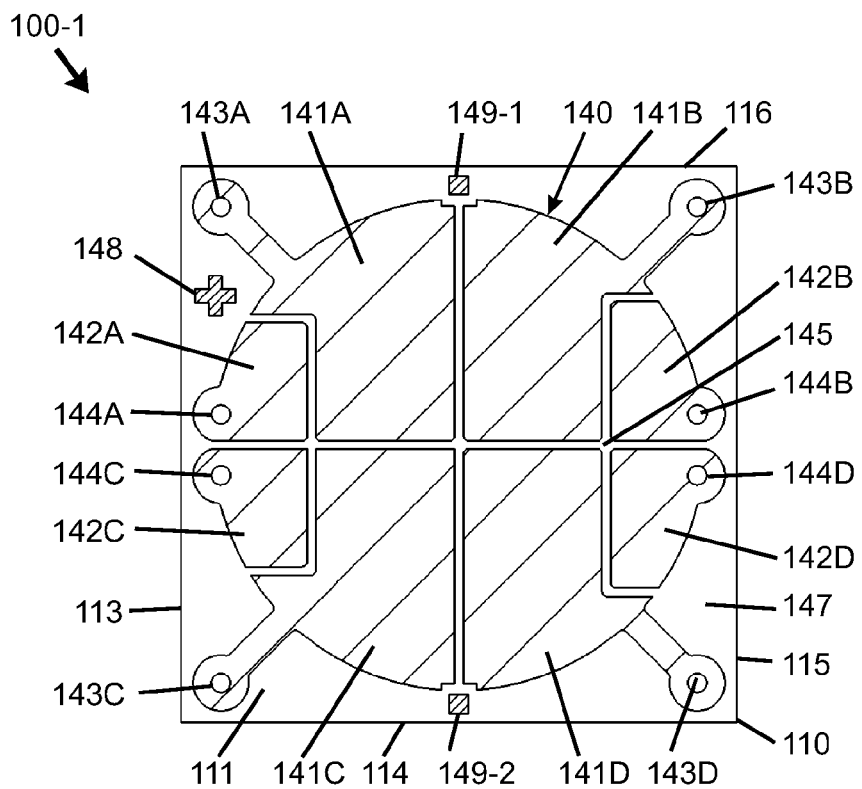
FIG._1C
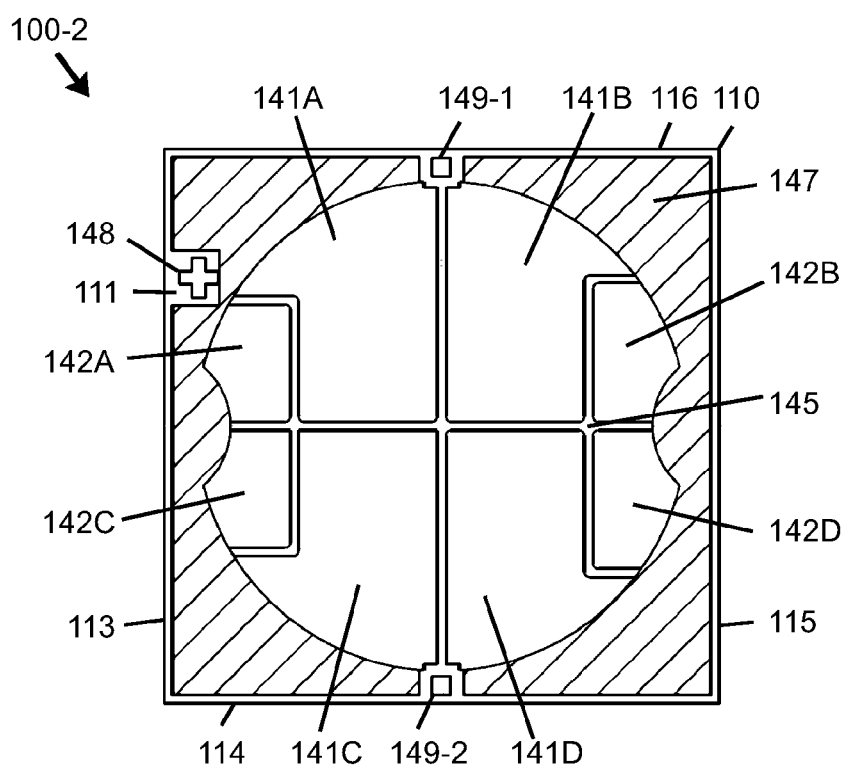
FIG._1D

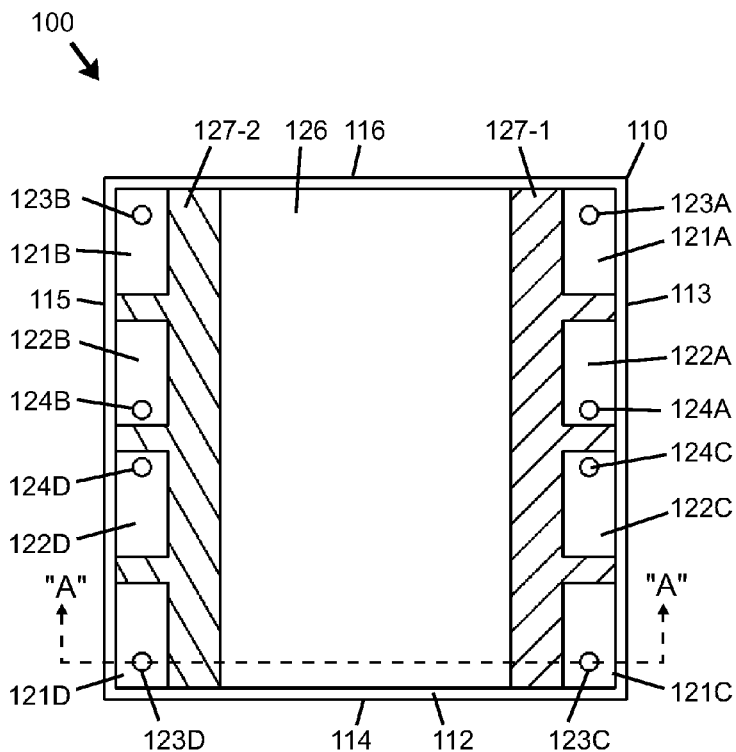
FIG._1E
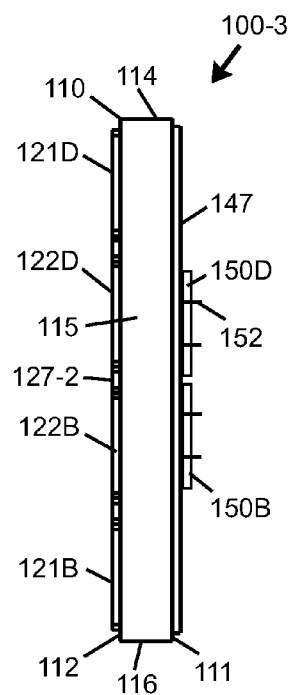
FIG._1F
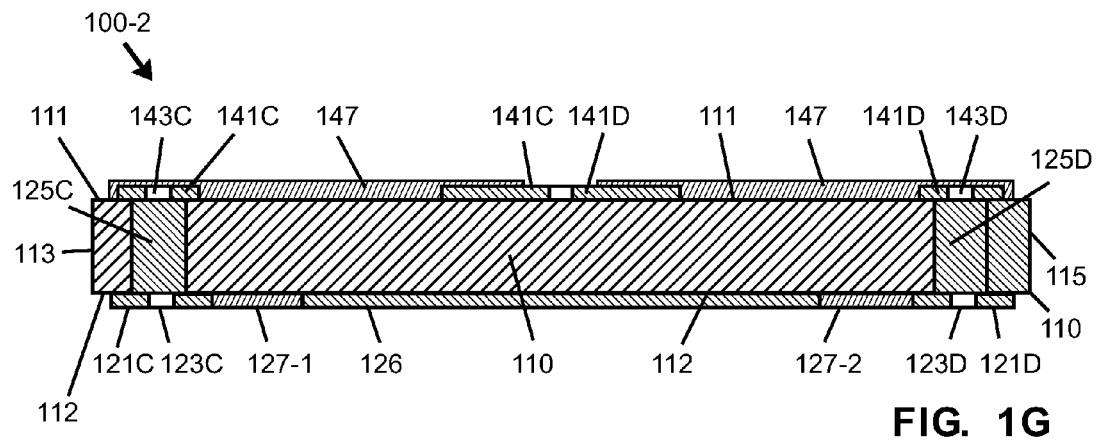
FIG._1G

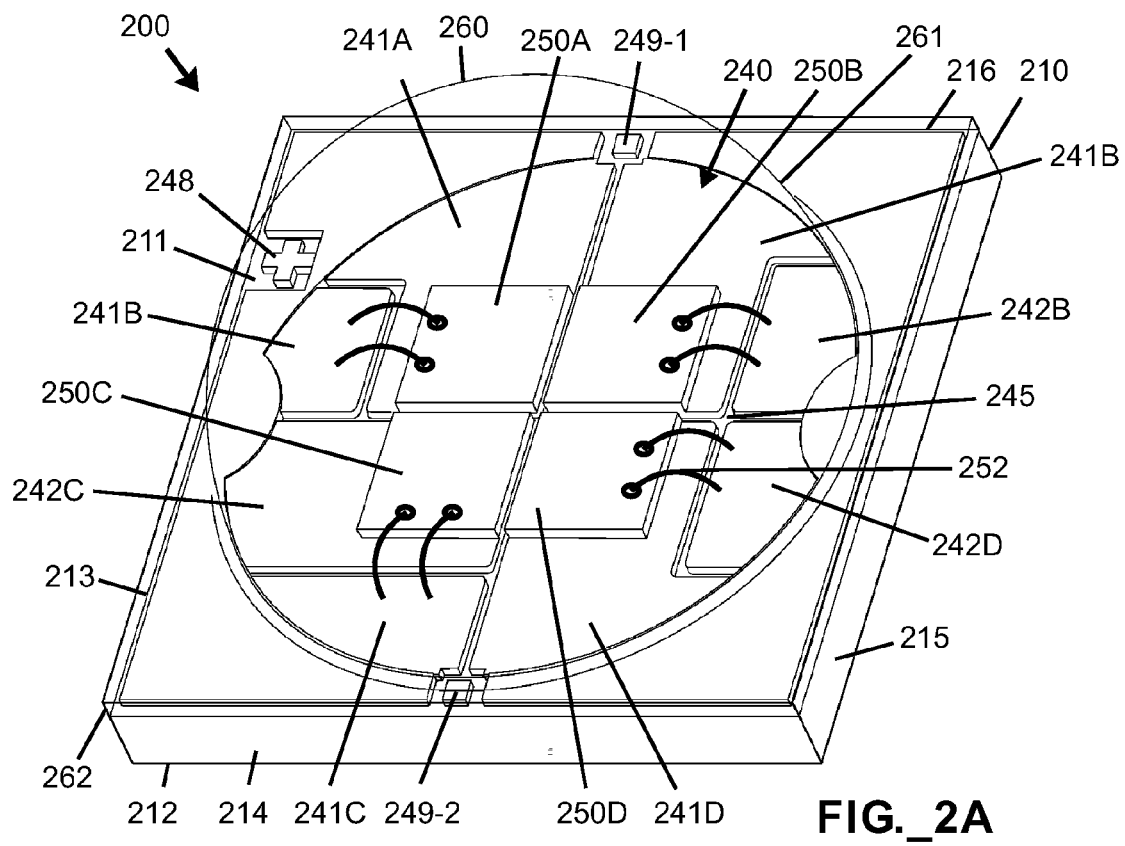
FIG._2A
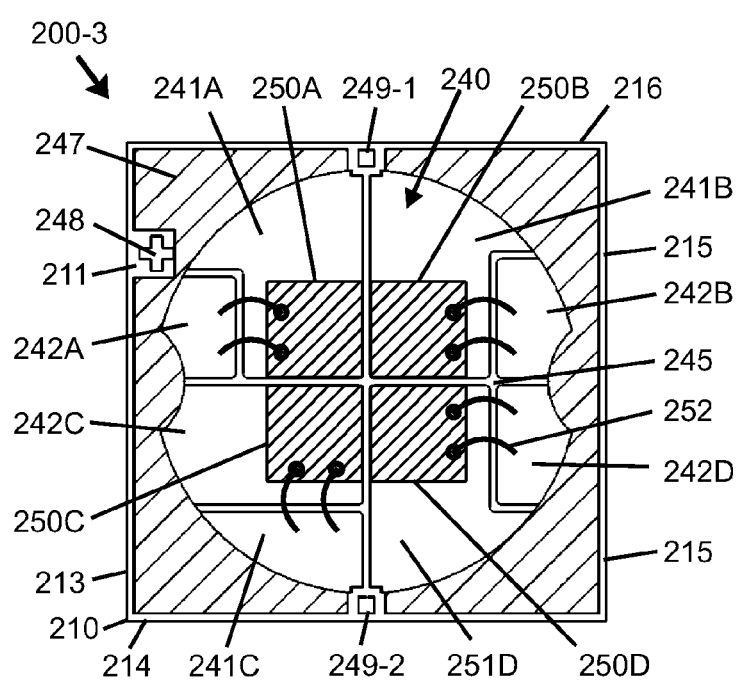
FIG._2B

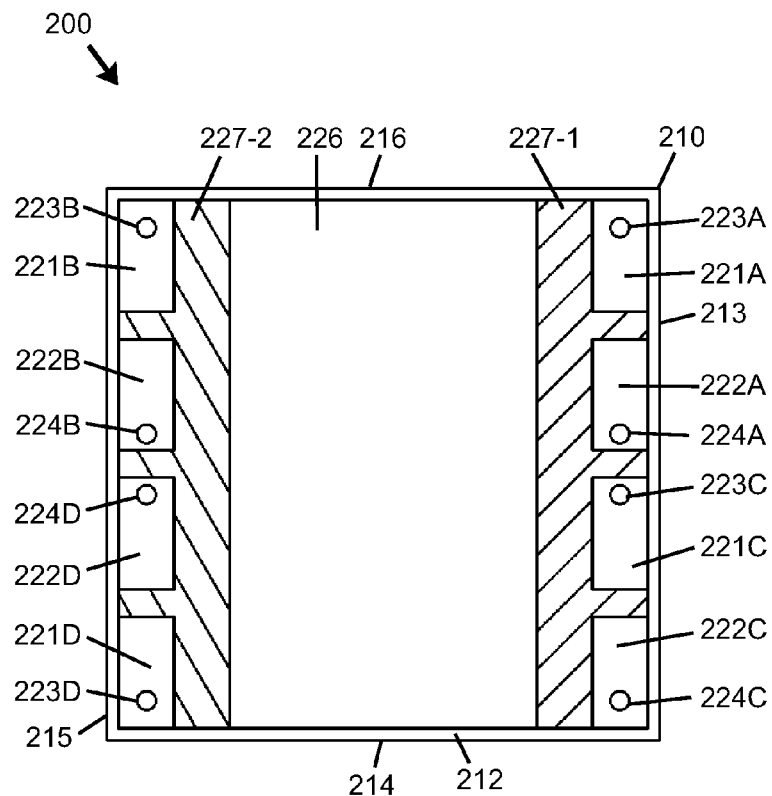
FIG._2E
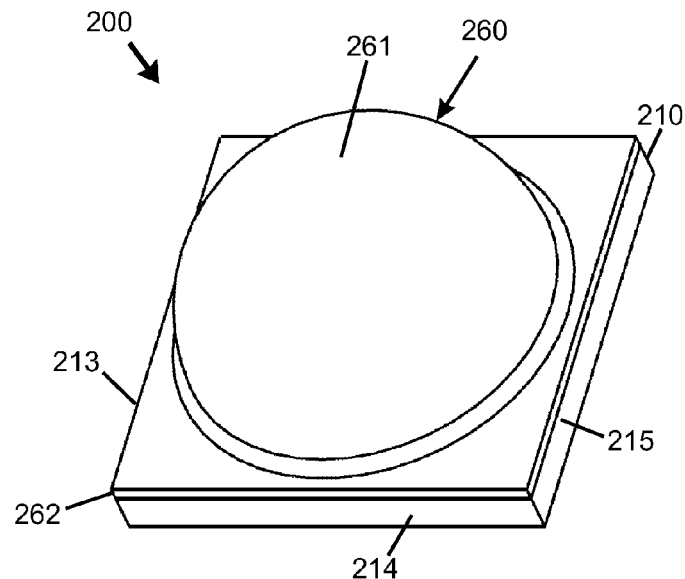
FIG._2F

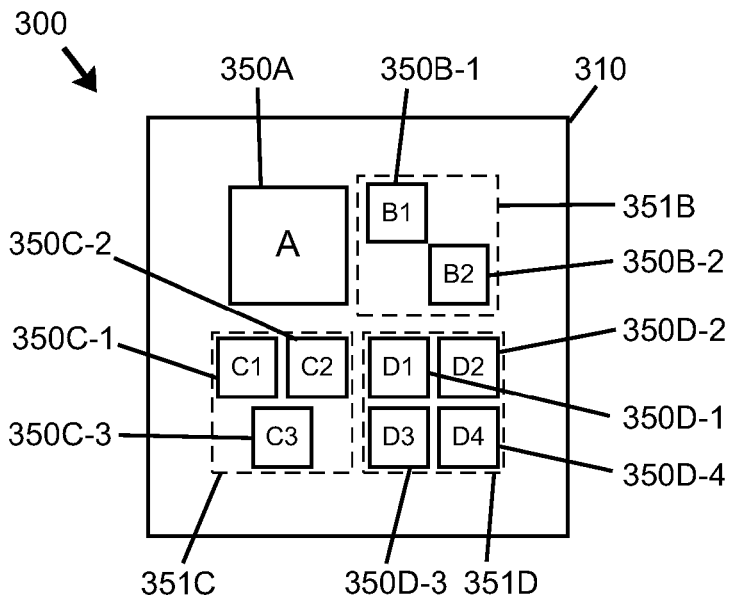
FIG._3
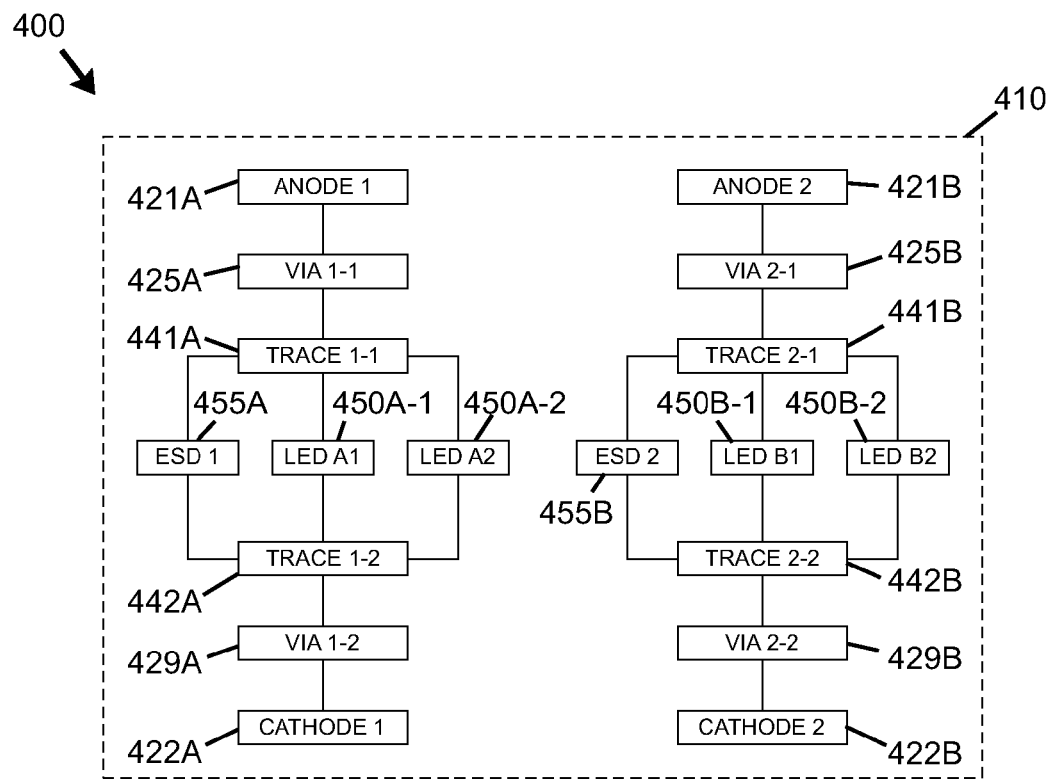
FIG._4

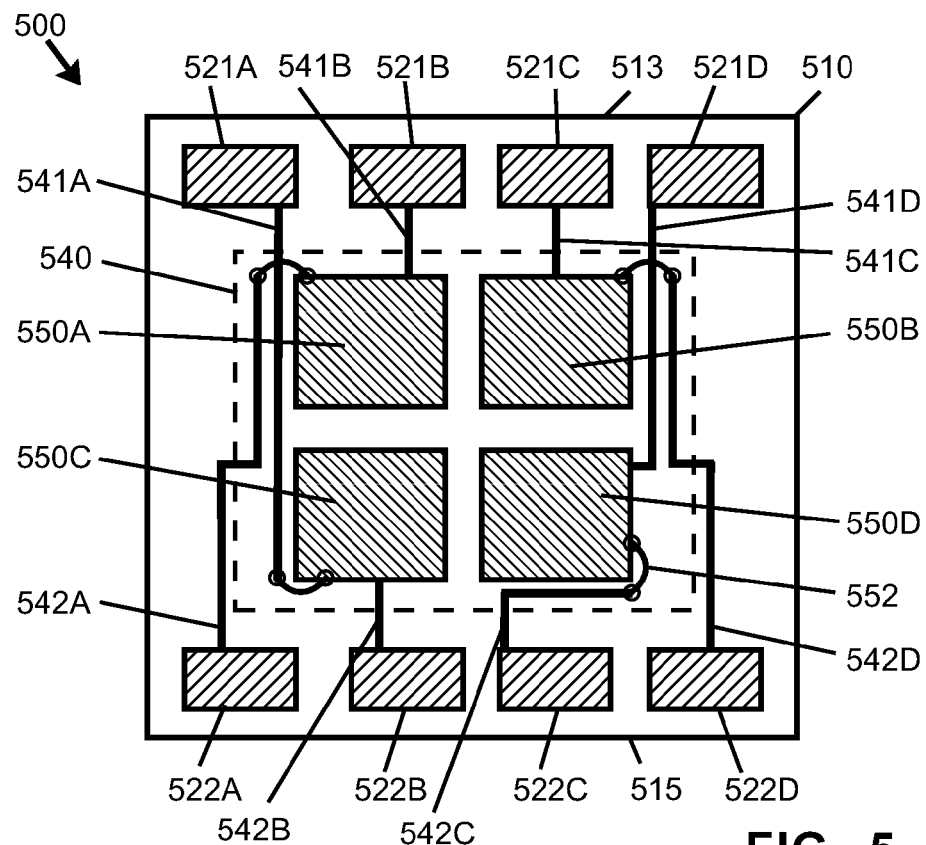
FIG._5
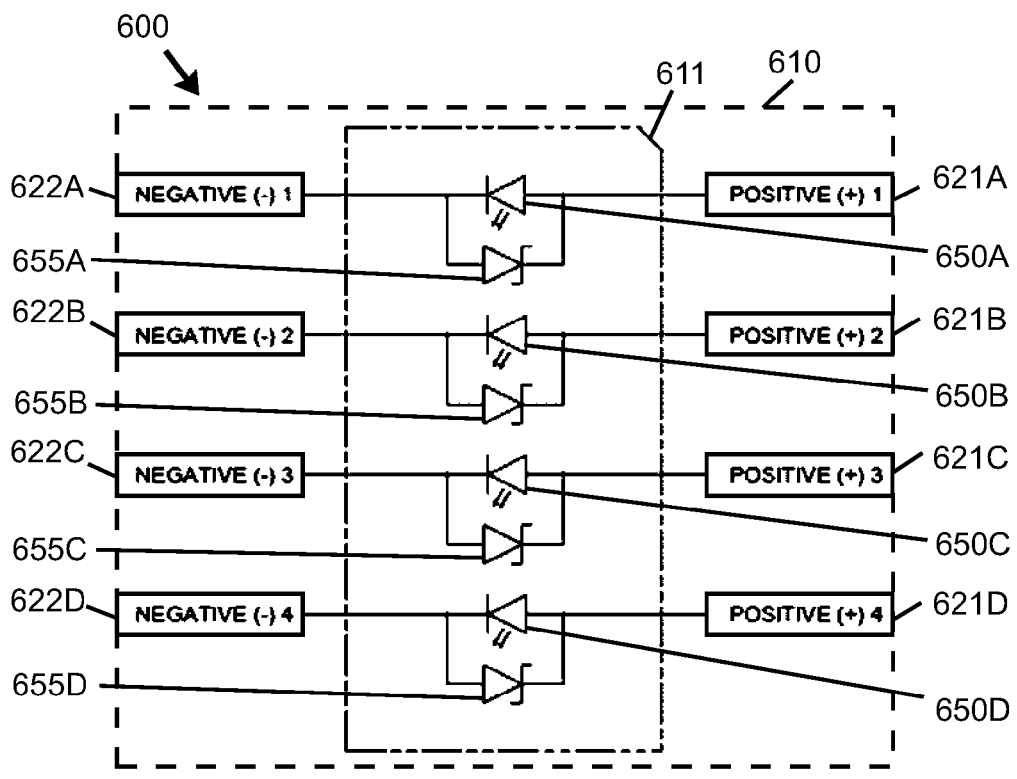
FIG._6

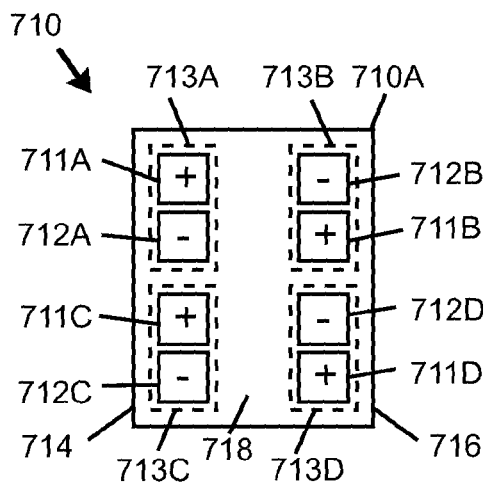
FIG._7A
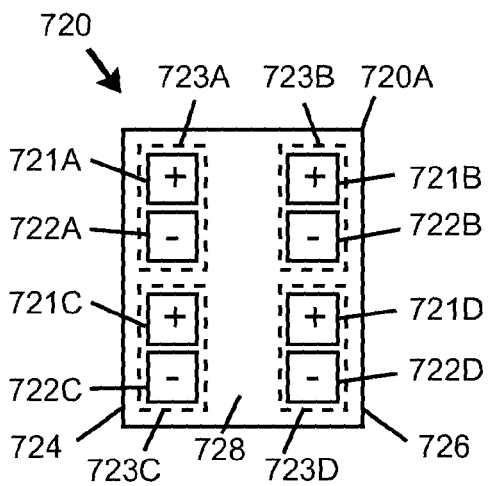
FIG._7B
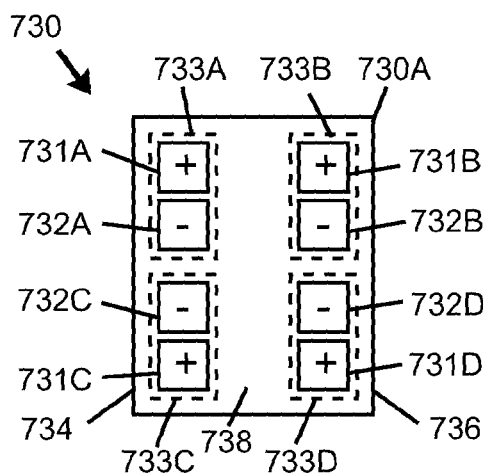
FIG._7C
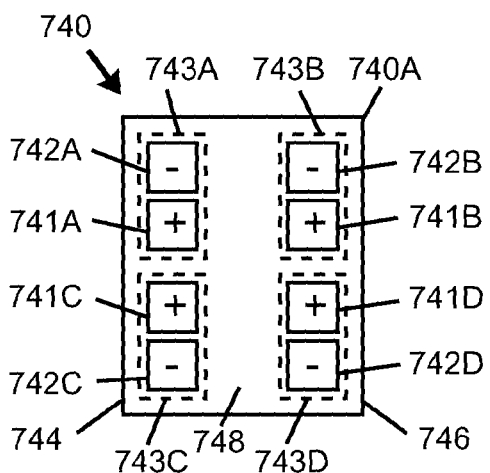
FIG._7D
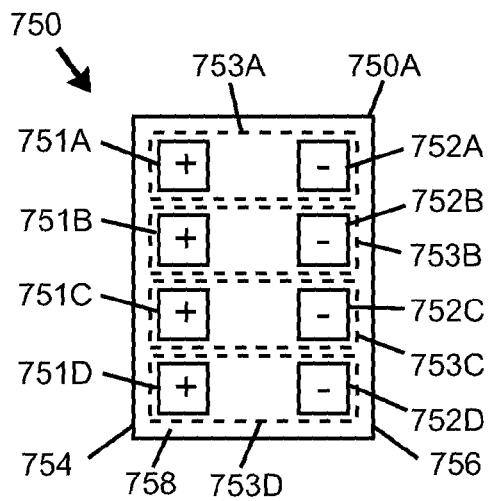
FIG._7E

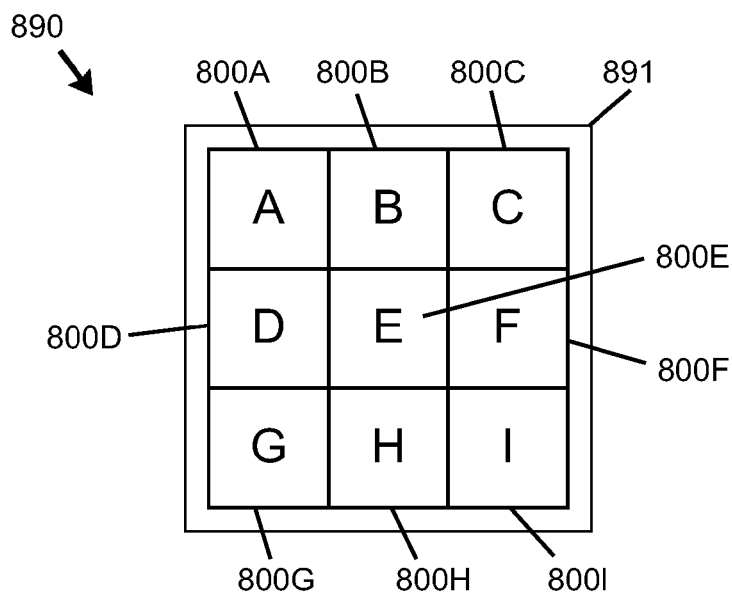
FIG._8
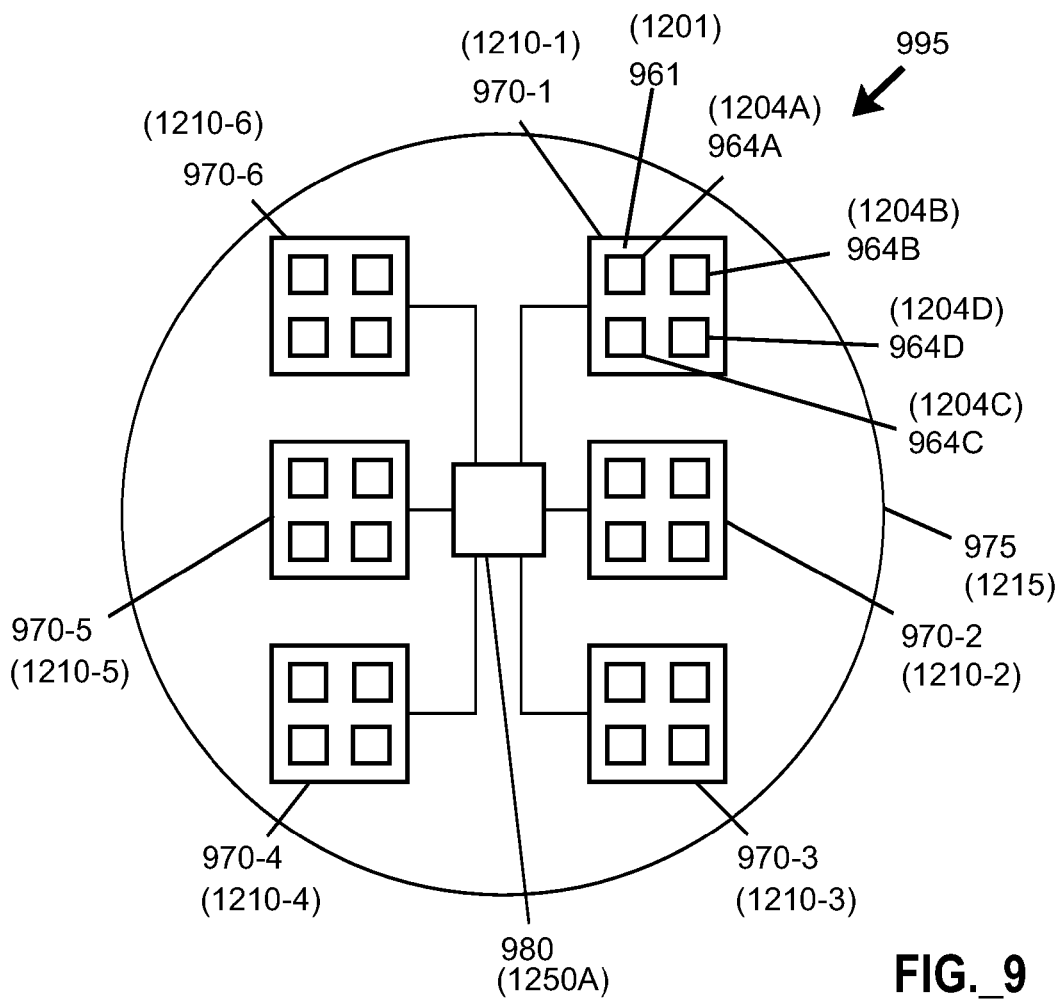
FIG._9

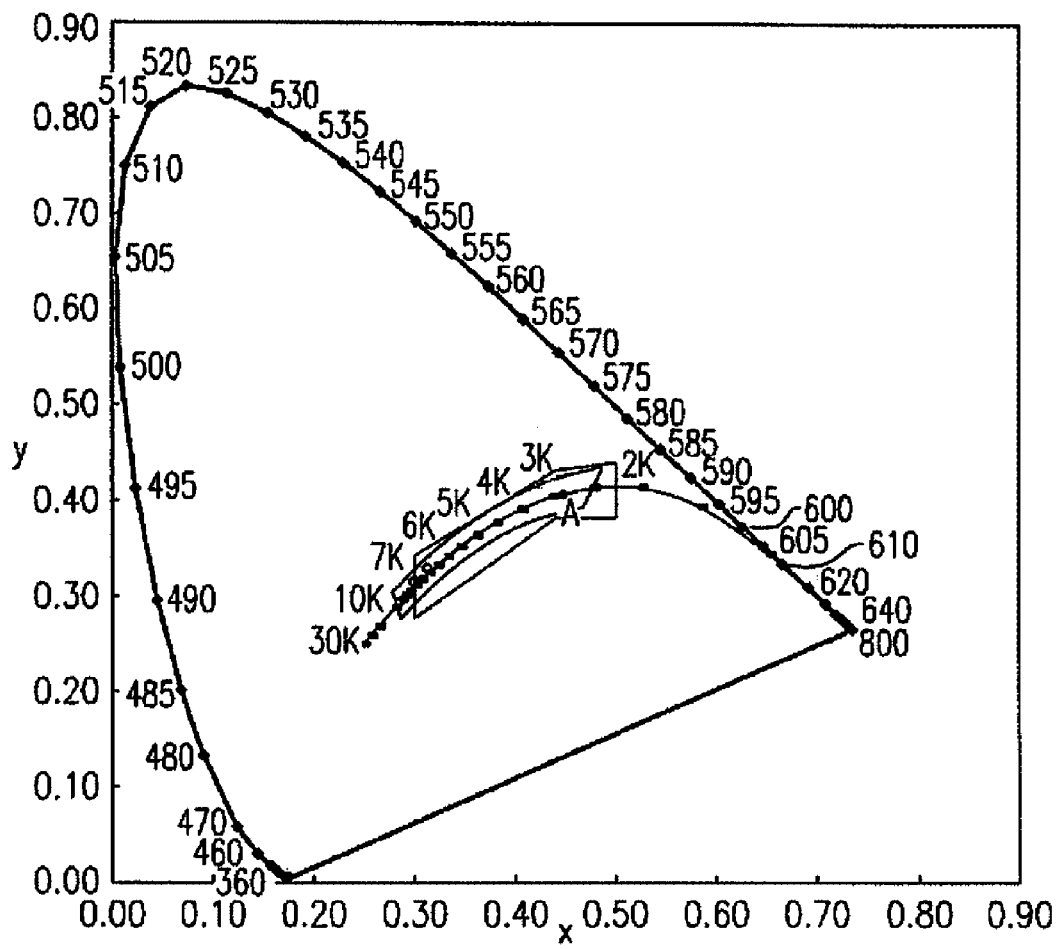
FIG._10
(RELATED ART)

LIGHT EMITTING DEVICES INCLUDING MULTIPLE ANODES AND CATHODES

TECHNICAL FIELD

Subject matter herein relates to solid state lighting devices, including multi-emitter packages with different emitters or groups of emitters being separately controllable using multiple anodes and multiple cathodes, and methods of making and using same.

BACKGROUND

Solid state light sources may be used to provide colored (e.g., non-white) or white light (e.g., perceived as being white or near-white). A solid state lighting device may include, for example, at least one organic or inorganic light emitting diode ("LED") or a laser. White solid state emitters have been investigated as potential replacements for white incandescent or fluorescent lamps due to reasons including substantially increased efficiency and longevity. Longevity of solid state emitters is of particular benefit in environments where access is difficult and/or where change-out costs are extremely high.

A solid state lighting device produces light (ultraviolet, visible, or infrared) by exciting electrons across the band gap between a conduction band and a valence band of a semiconductor active (light-emitting) layer, with the electron transition generating light at a wavelength that depends on the band gap. Thus, the color (wavelength) of the light emitted by a solid state emitter depends on the materials of the active layers thereof. Solid state light sources provide potential for very high efficiency relative to conventional incandescent or fluorescent sources, but present significant challenges in simultaneously achieving good efficacy, good color reproduction, and color stability (e.g., with respect to variations in operating temperature).

Color reproduction is commonly measured using Color Rendering Index (CRI) or average Color Rendering Index (CRI Ra). In the calculation of the CRI, the color appearance of 14 reflective samples is simulated when illuminated by a reference illuminant and the test source. The difference in color appearance $\Delta E_i$, for each sample, between the test and reference illumination, is computed in CIE 1964 W*U*V* uniform color space. It therefore provides a relative measure of the shift in surface color and brightness of an object when lit by a particular lamp. The general color rendering index CRI Ra is a modified average utilizing the first eight indices, all of which have low to moderate chromatic saturation. The CRI Ra equals 100 (a perfect score) if the color coordinates and relative brightness of a set of test colors being illuminated by the illumination system are the same as the coordinates of the same test colors being irradiated by the reference radiator. Daylight has a high CRI (Ra of approximately 100), with incandescent bulbs also being relatively close (Ra greater than 95), and fluorescent lighting being less accurate (typical Ra of 70-80) for general illumination use where the colors of objects are not important. For some general interior illumination, a CRI Ra>80 is acceptable. CRI Ra>85, and more preferably, CRI Ra>90, provides greater color quality.

CRI only evaluates color rendering, or color fidelity, and ignores other aspects of color quality, such as chromatic discrimination and observer preferences. The Color Quality Scale (CQS) developed by National Institute of Standards and Technology (NIST) is designed to incorporate these other aspects of color appearance and address many of the shortcomings of the CRI, particularly with regard to solid-state lighting. The method for calculating the CQS is based on modifications to the method used for the CRI, and utilizes set of 15 Munsell samples having much higher chroma than the CRI indices.

Aspects relating to the present inventive subject matter may be better understood with reference to the 1931 CIE (Commission International de l'Eclairage) Chromaticity Diagram, which is well-known and readily available to those of ordinary skill in the art. The 1931 CIE Chromaticity Diagram maps out the human color perception in terms of two CIE parameters x and y. The spectral colors are distributed around the edge of the outlined space, which includes all of the hues perceived by the human eye. The boundary line represents maximum saturation for the spectral colors.

The chromaticity coordinates (i.e., color points) that lie along the blackbody locus obey Planck's equation: $E(\lambda)=A \lambda^{-5}/(e^{B/T}-1)$, where E is the emission intensity, $\lambda$ is the emission wavelength, T the color temperature of the blackbody, and A and B are constants. Color coordinates that lie on or near the blackbody locus yield pleasing white light to a human observer. The 1931 CIE Diagram includes temperature listings along the blackbody locus (embodying a curved line emanating from the right corner). These temperature listings show the color path of a blackbody radiator that is caused to increase to such temperatures. As a heated object becomes incandescent, it first glows reddish, then yellowish, then white, and finally bluish. This occurs because the wavelength associated with the peak radiation of the blackbody radiator becomes progressively shorter with increased temperature, consistent with the Wien Displacement Law. Illuminants which produce light that is on or near the blackbody locus can thus be described in terms of their color temperature.

The term "white light" or "whiteness" does not clearly cover the full range of colors along the BBL since it is apparent that a candle flame and other incandescent sources appear yellowish, i.e., not completely white. Accordingly, the color of illumination may be better defined in terms of correlated color temperature (CCT) and in terms of its proximity to the BBL. The pleasantness and quality of white illumination decreases rapidly if the chromaticity point of the illumination source deviates from the BBL by a distance of greater than 0.01 in the x, y chromaticity system. This corresponds to the distance of about 4 MacAdam ellipses, a standard employed by the lighting industry. A lighting device emitting light having color coordinates that are within 4 MacAdam step ellipses of the BBL and that has a CRI Ra>80 is generally acceptable as a white light for illumination purposes. A lighting device emitting light having color coordinates within 7 MacAdam ellipses of the BBL and that has a CRI Ra>70 is used as the minimum standards for many other white lighting devices including compact fluorescent and solid state lighting devices.

General illumination generally has a color temperature between 2,000 K and 10,000 K, with the majority of lighting devices for general illumination being between 2,700 K and 6,500 K. The white area proximate to (i.e., within approximately 8 MacAdam ellipses of) of the BBL and between 2,500 K and 10,000 K, is shown in FIG. 10 (based on the 1931 CIE diagram).

Illumination with a CRI Ra of less than 50 is very poor and only used in applications where there is no alternative for economic issues. Lights with a CRI Ra between 70 and 80 have application for general illumination where the colors of objects are not important. For some general interior illumination, a CRI Ra>80 is acceptable. A light with color coordinates within 4 MacAdam step ellipses of the Planckian locus and a CRI Ra>85 is more suitable for general illumination purposes. CRI Ra>90 is preferable and provides greater color quality.

Because light that is perceived as white is necessarily a blend of light of two or more colors (or wavelengths), and light emitting diodes are inherently narrow-band emitters, no single light emitting diode junction has been developed that can produce white light. A representative example of a white LED lamp includes a blue LED chip (e.g., made of InGaN and/or GaN), arranged to stimulate a phosphor one or more phosphors (e.g., commonly yellow phosphors such as YAG:Ce or BOSE). A portion of the emissions of the blue LED chip pass through the phosphor(s), while another portion of such emissions is absorbed by the phosphor(s), which becomes excited and emits yellow emissions. The resulting mixture of blue and yellow light (sometimes termed 'blue shifted yellow' or 'BSY' light) may be perceived as cool white light. Cool white LEDs have a color temperature of approximately 5000K, which is generally not visually comfortable for general illumination, but may be desirable for the illumination of commercial goods or advertising and printed materials. Various methods exist to enhance cool white light to increase its warmth, including supplementation with a red LEDs or red phosphor. Additional or different supplemental LEDs and/or phosphors (e.g., of other colors) may be used, including but not limited to LEDs and/or phosphors having peak wavelengths in the long wavelength blue, cyan, green, yellow, amber, orange, and red spectral regions.

Various methods exist to enhance cool white light to increase its warmth. Acceptable color temperatures for indoor use are typically in a range of from 2700-3500K; however, warm white LED devices are typically significantly less efficient than cool white LED devices. To promote warm white colors, an orange phosphor or a combination of a red phosphor (e.g., CaAlSiN3 ('CASN') based phosphor) and yellow phosphor (e.g., Ce:YAG or YAG:Ce) can be used in conjunction with a blue LED. A green phosphor (e.g. LuAG:Ce) may additionally or alternatively be provided. Cool white emissions from a BSY element (including a blue emitter and yellow phosphor) may also be supplemented with a red LED, such as disclosed by U.S. Pat. No. 7,095,056 to Vitta, et al. and U.S. Pat. No. 7,213,940 to Negley et al. (with each of the foregoing patents being hereby incorporated by reference herein), to provide warmer light. While such devices permit the correlative color temperature (CCT) to be changed, the CRI of such devices may be reduced significantly at higher color temperatures.

To provide enhanced color rendering, multiple lumiphors (e.g., phosphors) may be arranged to be stimulated by one or more solid state emitters. For example, one or more short wavelength solid state emitters (e.g., blue LED) may be used to stimulate emissions from a mixture of lumiphoric materials or discrete layers of lumiphoric material including red, yellow, and green lumiphoric materials. Use of red, yellow, and green lumiphoric materials arranged to be stimulated by blue LEDs is disclosed, for example, in U.S. Patent Application Publication No. 2011/0220920, which is hereby incorporated by reference as if set forth fully herein.

Use of red and blue LEDs in the same device entails additional issues, since phosphide-based red LEDs exhibit substantially different changes in intensity and/or chromaticity than nitride-based blue LEDs with respect to changes in device operating temperature. That is, red LEDs include active regions typically formed of Group III phosphide (e.g., (Al,In,Ga)P) material, in contrast to blue LEDs, which include active regions typically formed of Group III nitride materials (e.g., represented as (Al,In,Ga)N, including but not limited to InGaN). Group III phosphide materials typically exhibit substantially less temperature stability than Group III nitride materials. Due to their chemistry, red LEDs lose a significant portion (e.g., 40-50%) of their efficacy when operating at 85° C. versus operating at a cold condition (i.e., room temperature or less). When red and blue LEDs are in conductive thermal communication with one another (e.g., affixed to a common substrate or in thermal communication with a common heatsink), heat emanating from the blue LEDs may increase the temperature of the red LEDs. It may be difficult to maintain a relatively constant color point over a wide range of temperatures (including high temperatures) utilizing a device including a Group III-nitride-based blue LED (e.g., as part of a BSY emitter) and Group III-phosphide based red LED without adjusting supply of current to at least one of the BSY element and the red LED, due to the different temperature responses of the blue and red LED.

As an alternative to stimulating a yellow phosphor with a blue LED, another method for generating white emissions involves combined use of red, green, and blue ("RGB") light emitting diodes in a single package. The combined spectral output of the red, green, and blue emitters may be perceived by a user as white light. Each "pure color" red, green, and blue diode typically has a full-width half-maximum (FWHM) wavelength range of from about 15 nm to about 30 nm. Due to the narrow FWHM values of these LEDs (particularly the green and red LEDs), aggregate emissions from the red, green, and blue LEDs exhibit low color rendering in general illumination applications.

Another example of a known white LED lamp includes one or more ultraviolet (UV)-based LEDs combined with red, green, and blue phosphors. Such lamps typically provide reasonably high color rendering, but exhibit low efficacy due to substantial Stokes losses.

The art continues to seek improved solid state lighting devices that address one or more limitations inherent to conventional devices. For example, it would be desirable to provide solid state lighting devices capable of providing white light in a wider variety of applications, with greater energy efficiency, with improved color rendering over a range of correlative color temperatures, with improved efficacy, with improved color stability at high flux, with reduced size, with enhanced configuration flexibility, and/or with longer duration of service.

SUMMARY

The present invention relates in various aspects to solid state (e.g., LED) lighting devices including multiple solid state light emitters mounted on or over a substrate, wherein various solid state emitters are independently controllable (e.g., with multiple pairs of anodes and cathodes).

In one aspect, the invention relates to a light emitting diode (LED) device comprising: a substrate comprising insulating material and including a top surface, a bottom surface, and at least one side wall extending between the top surface and the bottom surface; a plurality of LEDs mounted on or over the top surface; and a plurality of anodes and a plurality of cathodes arranged on the bottom surface and in conductive electrical communication with the plurality of LEDs; wherein at least a first LED of the plurality of LEDs is in conductive electrical communication with a first anode of the plurality of anodes and with a first cathode of the plurality of cathodes; and wherein at least a second LED of the plurality of LEDs is in conductive electrical communication with a second anode of the plurality of anodes and with a second cathode of the plurality of cathodes.

In another aspect, the invention relates to a light emitting diode (LED) device comprising: a substrate comprising insulating material and including a top surface, a bottom surface, and at least one side wall extending between the top surface and the bottom surface; a plurality of die attach pads patterned in or on the top surface; a plurality of LEDs mounted to the plurality of die attach pads; and a plurality of electrically conductive vias defined in the substrate between the top surface and the bottom surface; wherein at least a first LED of the plurality of LEDs is in conductive electrical communication with a first pair of vias of the plurality of vias; and wherein at least a second LED of the plurality of LEDs is in conductive electrical communication with a second pair of vias of the plurality of vias that differs from the first pair of vias.

In another aspect, the invention relates to a light emitting diode (LED) device comprising: a plurality of LEDs mounted on or over a top surface of a substrate comprising a ceramic material; a molded lens arranged over the plurality of LEDs and arranged to transmit light generated by the LEDs; a plurality of anodes and a plurality of cathodes in conductive electrical communication with the plurality of LEDs; wherein at least two LEDs of the plurality of LEDs are independently controllable using the plurality of anodes and the plurality of cathodes.

In another aspect, the invention relates to a light emitting diode (LED) device comprising: a substrate comprising insulating material and including a top surface and a plurality of conductive traces patterned on or over the top surface; a plurality of LEDs mounted on or over the top surface and in conductive electrical communication with the plurality of conductive traces, wherein the plurality of LEDs comprises (i) a first blue LED arranged to stimulate emissions of a first yellow lumiphor disposed on the first blue LED, (ii) a second blue LED arranged to stimulate emissions of a second yellow lumiphor disposed on the second blue LED, and (iii) a red LED; and a plurality of anodes and a plurality of cathodes arranged in conductive electrical communication with the plurality of conductive traces and the plurality of LEDs; wherein each of the first blue LED, the second blue LED, and the red LED is independently controllable.

In another aspect, the invention relates to a light emitting diode (LED) device comprising: a substrate comprising insulating material and including a top surface and a plurality of conductive traces patterned on or over the top surface; a plurality of LEDs mounted on or over the top surface and in conductive electrical communication with the plurality of conductive traces, wherein the plurality of LEDs comprises a first LED comprising a first peak wavelength, a second LED comprising a second peak wavelength, and a third LED comprising a third peak wavelength; and a plurality of anodes and a plurality of cathodes arranged in conductive electrical communication with the plurality of conductive traces and the plurality of LEDs; wherein each of the first LED, the second LED, and the third LED is independently controllable; wherein the first peak wavelength and the second peak wavelength are substantially the same or differ from one another by less than 20 nm; and wherein the third peak wavelength differs from each of the first peak wavelength and the second peak wavelength by at least 40 nm.

In another aspect, the invention relates to a method comprising illuminating an object, a space, or an environment, utilizing a LED device as described herein.

In another aspect, any of the foregoing aspects, and/or various separate aspects and features as described herein, may be combined for additional advantage.

Other aspects, features and embodiments of the invention will be more fully apparent from the ensuing disclosure and appended claims.

BRIEF DESCRIPTION OF THE DRAWINGS

FIG. 1A is a first perspective view of a solid state emitter package according to one embodiment, the emitter package including multiple LEDs arranged over an upper surface of a common substrate with multiple anodes and cathodes along a lower surface of the substrate.

FIG. 1B is a top plan view of a first subassembly of the emitter package of FIG. 1A, lacking a lens.

FIG. 1C is a top plan view of a second subassembly of the emitter package of FIG. 1A, lacking a lens, soldermask material, and LEDs.

FIG. 1D is a top plan view of a third subassembly of the emitter package of FIG. 1A, lacking a lens and LEDs.

FIG. 1E is a bottom plan view of each of the emitter package of FIG. 1A and the subassemblies of FIGS. 1B, 1C, and 1D.

FIG. 1F is a right side elevation view of the first subassembly of FIG. 1B.

FIG. 1G is a side cross-sectional view of the third subassembly of FIG. 1D, taken along section lines "A"-"A" depicted in FIG. 1E.

FIG. 2A is a first perspective view of a solid state emitter package according to another embodiment, the emitter package including multiple LEDs arranged over an upper surface common substrate with multiple anodes and cathodes along a lower surface of the substrate.

FIG. 2B is a top plan view of a first subassembly of the emitter package of FIG. 2A, lacking a lens.

FIG. 2E is a bottom plan view of each of the emitter package of FIG. 1A and the subassemblies of FIGS. 2B, 2C, and 2D.

FIG. 2F is a second perspective view of the emitter package of FIG. 2A.

FIG. 3 is a schematic top view of a solid state lighting device (e.g., emitter package) including multiple separately controllable groups or strings of solid state emitters according to one embodiment.

FIG. 4 is a schematic diagram showing electrical connections between various elements of a solid state emitter package including multiple separately controllable groups or strings of solid state emitters arranged in communication with multiple anodes and multiple cathodes according to one embodiment.

FIG. 5 is a schematic diagram showing electrical connections between various elements of a multi-emitter solid state emitter package including multiple anodes and multiple cathodes arranged along opposing ends of one surface of the emitter package according to one embodiment.

FIG. 6 is a schematic diagram showing interconnections between multiple emitters, multiple electrostatic discharge protection elements, and multiple anodes and cathodes of a multi-emitter solid state emitter package according to one embodiment.

FIG. 7A is a schematic diagram of a multi-emitter solid state emitter package according to one embodiment, depicting multiple anodes and multiple cathodes along a lower surface of the package according to a first arrangement.

FIG. 7B is a schematic diagram of a multi-emitter solid state emitter package according to one embodiment, depicting multiple anodes and multiple cathodes along a lower surface of the package according to a second arrangement.

FIG. 7C is a schematic diagram of a multi-emitter solid state emitter package according to one embodiment, depicting multiple anodes and multiple cathodes along a lower surface of the package according to a third arrangement.

FIG. 7D is a schematic diagram of a multi-emitter solid state emitter package according to one embodiment, depicting multiple anodes and multiple cathodes along a lower surface of the package according to a fourth arrangement.

FIG. 7E is a schematic diagram of a multi-emitter solid state emitter package according to one embodiment, depicting multiple anodes and multiple cathodes along a lower surface of the package according to a fifth arrangement.

FIG. 8 is a schematic diagram of a lighting device including an array of solid state emitter packages according to one embodiment.

FIG. 9 is a schematic diagram of a light fixture including multiple solid state emitter packages according to one embodiment.

FIG. 10 is a 1931 CIE Chromaticity Diagram including representation of the blackbody locus, and further illustrating an approximately white area bounding the blackbody locus.

DETAILED DESCRIPTION

Figure 1H:
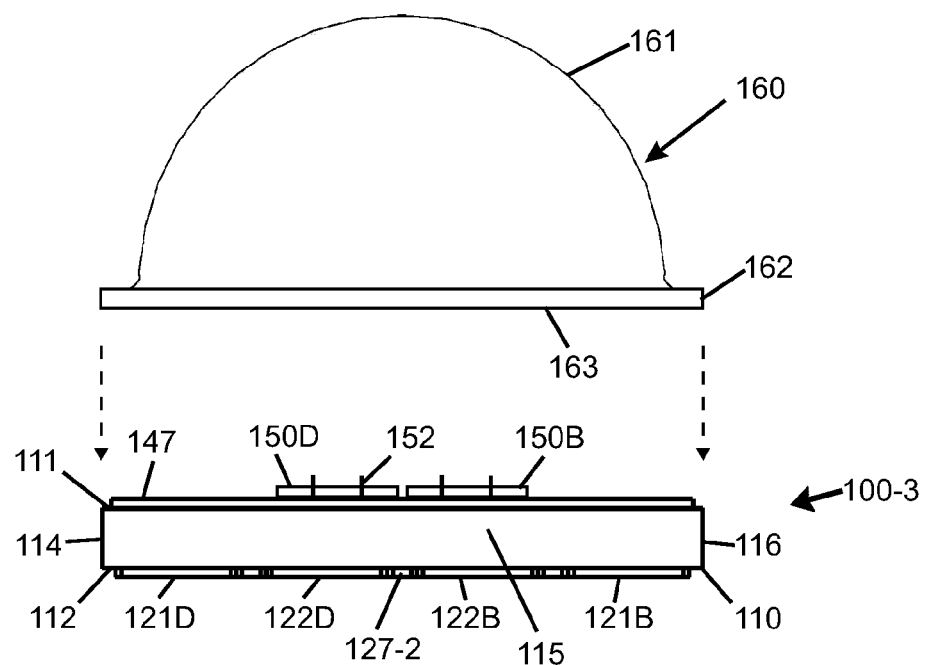
FIG. 1H is an exploded right side elevation view of the emitter package of FIG. 1A, separately depicting the lens registered with the first subassembly of FIG. 1B.

The present invention relates in certain aspects to lighting devices including multiple solid state light emitters mounted on or over a substrate comprising an insulating material (e.g., ceramic), wherein various solid state emitters are independently controllable (e.g., with multiple pairs of anodes and cathodes). In certain embodiments, a plurality of anodes and a plurality of cathodes arranged on the bottom surface and in conductive electrical communication with a plurality of LEDs to permit different LEDs to be independent controlled. In certain embodiments, a plurality of electrically conductive vias are defined in an insulating substrate, wherein different LEDs are in conductive electrical communication with different pairs of vias, and each pair of vias is preferably in conductive electrical communication with a different anode/cathode pair. In certain embodiments, a lighting device includes a plurality of LEDs with at least two LEDs that are independently controllable using a plurality of anodes and a plurality of cathodes, the device further including a molded lens arranged over the plurality of LEDS which are mounted on or over a substrate comprising ceramic material. In certain embodiments, a LED device includes an substrate comprising insulating material with conductive traces patterned thereon and a plurality of independently controllable LEDs arranged over the substrate, the independently controllable LEDs including a first BSY emitter (blue LED arranged to stimulate a yellow lumiphor), a second BSY emitter, and a red LED. In certain embodiments, a LED device includes a substrate comprising insulating material with conductive traces patterned thereon and a plurality of independently controllable LEDs arranged over the substrate, the LEDs including independently controllable first, second, and third LEDs, wherein a first peak wavelength of a first LED and the second peak wavelength of a second LED are substantially the same or differ from one another by less than a first threshold (e.g., less than 25 nm, less than 20 nm, less than 15 nm, less than 10 nm, less than 5 nm, less than 3 nm, less than 2 nm, or less than 1 nm) and wherein a third peak wavelength of a third LED differs from each of the first peak wavelength and the second peak wavelength by at least a second threshold (e.g., at least 10 nm, at least 20 nm, at least 30 nm, at least 40 nm, at least 50 nm, at least 60 nm, at least 70 nm, at least 80 nm, at least 90 nm, or at least 100 nm).

Unless otherwise defined, terms used herein should be construed to have the same meaning as commonly understood by one of ordinary skill in the art to which this invention belongs. It will be further understood that terms used herein should be interpreted as having a meaning that is consistent with their meaning in the context of this specification and the relevant art, and should not be interpreted in an idealized or overly formal sense unless expressly so defined herein.

Embodiments of the invention are described herein with reference to cross-sectional, perspective, elevation, and/or plan view illustrations that are schematic illustrations of idealized embodiments of the invention. Variations from the shapes of the illustrations as a result, for example, of manufacturing techniques and/or tolerances, are to be expected, such that embodiments of the invention should not be construed as limited to particular shapes illustrated herein. This invention may be embodied in different forms and should not be construed as limited to the specific embodiments set forth herein. In the drawings, the size and relative sizes of layers and regions may be exaggerated for clarity.

Unless the absence of one or more elements is specifically recited, the terms "comprising," "including," and "having" as used herein should be interpreted as open-ended terms that do not preclude the presence of one or more elements.

It will be understood that when an element such as a layer, region, or substrate is referred to as being "on" another element, it can be directly on the other element or intervening elements may be present. Moreover, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions.

The terms "electrically activated emitter" and "emitter" as used herein refers to any device capable of producing visible or near visible (e.g., from infrared to ultraviolet) wavelength radiation, including but not limited to, xenon lamps, mercury lamps, sodium lamps, incandescent lamps, and solid state emitters, including diodes (LEDs), organic light emitting diodes (OLEDs), and lasers.

The terms "solid state light emitter" or "solid state emitter" may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials.

Solid state light emitting devices according to embodiments of the invention may include III-V nitride (e.g., gallium nitride) based LED chips or laser chips fabricated on a silicon, silicon carbide, sapphire, or III-V nitride growth substrate, including (for example) devices manufactured and sold by Cree, Inc. of Durham, N.C. Such LEDs and/or lasers may be configured to operate such that light emission occurs through the substrate in a so-called "flip chip" orientation. Such LED and/or laser chips may also be devoid of growth substrates (e.g., following growth substrate removal).

LED chips useable with lighting devices as disclosed herein may include horizontal devices (with both electrical contacts on a same side of the LED) and/or vertical devices (with electrical contacts on opposite sides of the LED). A horizontal device (with or without the growth substrate), for example, may be flip chip bonded (e.g., using solder) to a carrier substrate or printed circuit board (PCB), or wire bonded. A vertical device (without or with the growth substrate) may have a first terminal solder bonded to a carrier substrate, mounting pad, or printed circuit board (PCB), and have a second terminal wire bonded to the carrier substrate, electrical element, or PCB. Examples of vertical and horizontal LED chip structures are disclosed, for example, in U.S. Patent Application Publication No. 2008/0258130 to Bergmann et al. and in U.S. Patent Application Publication No. 2006/0186418 to Edmond et al., the disclosures of which are hereby incorporated by reference herein in their entireties. Although various embodiments shown in the figures may be appropriate for use with vertical LEDs, it is to be appreciated that the invention is not so limited, such that any combination of one or more of the following LED configurations may be used in a single solid state light emitting device: horizontal LED chips, horizontal flip LED chips, vertical LED chips, vertical flip LED chips, and/or combinations thereof, with conventional or reverse polarity. Given the variations in types, configurations, and polarities of solid state emitter chips, it is to be appreciated that the terms "anode" and "cathode" as applied to structures illustrated in the figures may be appropriate for use with certain solid state emitter chip types, but the terms may be reversed with respect to other solid state emitter chip types. In certain embodiments, wirebonds may be used to facilitate electrical connection to LED chips (whether as anode only, cathode only, or anode and cathode), but in other embodiments, wirebonds may be omitted (e.g., in cases involving use of LEDs having electrical contacts mounted solely on the bottom side thereof and soldered to conductive regions (e.g., traces) arranged on a top surface of a substrate or submount).

Electrically activated light emitters (including solid state light emitters) may be used individually or in groups to emit one or more beams to stimulate emissions of one or more lumiphoric materials (e.g., phosphors, scintillators, lumiphoric inks, quantum dots) to generate light at one or more peak wavelength, or of at least one desired perceived color (including combinations of colors that may be perceived as white). Inclusion of lumiphoric (also called 'luminescent') materials in lighting devices as described herein may be accomplished by direct coating on lumiphor support elements or lumiphor support surfaces (e.g., by powder coating, inkjet printing, or the like), adding such materials to lenses, and/or by embedding or dispersing such materials within lumiphor support elements or surfaces. Other materials, such as light scattering elements (e.g., particles) and/or index matching materials, may be associated with a lumiphoric material-containing element or surface. LED devices and methods as disclosed herein may include have multiple LEDs of different colors, one or more of which may be white emitting (e.g., including at least one LED with one or more lumiphoric materials).

In certain embodiments, one or more short wavelength solid state emitters (e.g., blue and/or cyan LED) may be used to stimulate emissions from a mixture of lumiphoric materials, or discrete layers of lumiphoric material, including red, yellow, and green lumiphoric materials. In certain embodiments, at least three independently controlled short wavelength (e.g., blue or cyan) LEDs may be provided in a single lighting device (e.g., including a single substrate, preferably with anodes and cathodes on a surface opposite that of the LEDs), with a first short wavelength LED arranged to stimulate emissions of a first red lumiphor, a second short wavelength LED arranged to stimulate emissions of a second yellow lumiphor, and a third short wavelength LED arranged to stimulate emissions of a third red lumiphor.

The expression "peak wavelength", as used herein, means (1) in the case of a solid state light emitter, to the peak wavelength of light that the solid state light emitter emits if it is illuminated, and (2) in the case of a lumiphoric material, the peak wavelength of light that the lumiphoric material emits if it is excited.

A wide variety of wavelength conversion materials (e.g., luminescent materials, also known as lumiphors or luminophoric media, e.g., as disclosed in U.S. Pat. No. 6,600,175 and U.S. Patent Application Publication No. 2009/0184616), are well-known and available to persons of skill in the art. Examples of luminescent materials (lumiphors) include phosphors, scintillators, day glow tapes, nanophosphors, quantum dots (e.g., such as provided by NNCrystal US Corp. (Fayetteville, Ark.)), and inks that glow in the visible spectrum upon illumination with (e.g., ultraviolet) light. One or more luminescent materials useable in devices as described herein may be down-converting or up-converting, or can include a combination of both types.

Some embodiments of the present invention may use solid state emitters, emitter packages, fixtures, luminescent materials/elements, power supply elements, control elements, and/or methods such as described in U.S. Pat. Nos. 7,564,180; 7,456,499; 7,213,940; 7,095,056; 6,958,497; 6,853,010; 6,791,119; 6,600,175, 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862, and/or 4,918,497, and U.S. Patent Application Publication Nos. 2009/0184616; 2009/0080185; 2009/0050908; 2009/0050907; 2008/0308825; 2008/0198112; 2008/0179611, 2008/0173884, 2008/0121921; 2008/0012036; 2007/0253209; 2007/0223219; 2007/0170447; 2007/0158668; 2007/0139923, and/or 2006/0221272; with the disclosures of the foregoing patents and published patent applications being hereby incorporated by reference as if set forth fully herein.

The expression "lighting device", as used herein, is not limited, except that it is capable of emitting light. That is, a lighting device can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting-work lights, etc., mirrors/vanity lighting, or any other light emitting device. In certain embodiments, lighting devices as disclosed herein are self-ballasted.

The inventive subject matter further relates in certain embodiments to an illuminated enclosure (the volume of which can be illuminated uniformly or non-uniformly), comprising an enclosed space and at least one lighting device as disclosed herein, wherein the lighting device illuminates at least a portion of the enclosure (uniformly or non-uniformly). The inventive subject matter further relates to an illuminated area, comprising at least one item, e.g., selected from among the group consisting of a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, a LCD display, a cave, a tunnel, a yard, a lamppost, etc., having mounted therein or thereon at least one lighting device as described herein. Methods include illuminating an object, a space, or an environment, utilizing one or more lighting devices as disclosed herein.

In certain embodiments, lighting devices as described herein including at least one electrically activated (e.g., solid state) emitter with a peak wavelength in the visible range. In certain embodiments, multiple electrically activated (e.g., solid state) emitters are provided, with groups of emitters or individual emitters being independently controllable. In certain embodiments, lighting devices as described herein include a first LED comprising a first LED peak wavelength, and include a second LED comprising a second LED peak wavelength that differs from the first LED peak wavelength by at least 20 nm, or by at least 30 nm. In such a case, each of the first wavelength and the second wavelength is preferably within the visible range.

In certain embodiments, multiple solid state emitters (e.g., LEDs) arranged to emit similar or different peak wavelengths are arranged on a common substrate (e.g., as part of a solid state emitter package), with different individual emitters or groups of emitters being separately controllable from other individual emitters or groups of emitters. Emitters having similar output wavelengths may be selected from targeted wavelength bins. Emitters having different output wavelengths may be selected from different wavelength bins, with peak wavelengths differing from one another by a desired threshold (e.g., at least 20 nm, at least 30 nm, at least 50 nm, or another desired threshold).

In certain embodiments, a lighting device (e.g., solid state emitter package) includes at least one BSY or white emitter component (including a blue solid state emitter arranged to stimulate emissions of a yellow lumiphor) in combination with at least one separately controllable red emitter (e.g., a red LED and/or a LED (e.g., UV, blue, cyan, green, etc.) arranged to stimulate emissions of a red lumiphor). Addition of the red emitter is useful to enhance warmth of the BSY or white emissions and improve color rendering, with the resulting combination being termed BSY+R or warm white. Separately controllability of the red and BSY components is useful to maintain a desired color point as temperature increases. Multiple independently controllable BSY components may be provided in addition to an independently controllable red solid state emitter. One or more supplemental solid state emitters and/or lumiphors of any suitable color (or peak wavelength) may be further provided.

In certain embodiments, a solid state lighting device (e.g., a solid state emitter package) include at least one BSY light emitting component supplemented with one or more supplemental emitters, such as long wavelength blue, cyan, green, yellow, amber, orange, red or any other desired colors. Presence of a cyan solid state emitter (which is preferably independently controllable) is particularly desirable in certain to permit adjustment or tuning of color temperature of a lighting device, since the tie line for a solid state emitter having a ~487 nm peak wavelength is substantially parallel to the blackbody locus for a color temperature of less than 3000K to about 4000K. Each electrically activated emitter is preferably independently controllable, to permit tuning of output color and/or color temperature.

In certain embodiments, a lighting device (e.g., solid state emitter package) includes a first BSY emitter component (including a blue solid state emitter arranged to stimulate emissions of a yellow lumiphor), a second BSY emitter component, and a third red solid state emitter (e.g., red LED), wherein each of the first BSY component, second BSY component, and third solid state emitter component is independently controllable. While is it known to provide independently controllable LEDs of substantially different wavelengths in a single solid state emitter package (e.g., a lighting device including red, green, and blue LEDs), it has heretofore not been desirable to provide multiple independently controllable BSY components in a single package since independent control of components with the same or similar spectral output would be considered unnecessary and would entail needless cost and complexity. In certain embodiments, multiple BSY components present in a single lighting device (e.g., a solid state emitter package) include blue LEDs with different peak wavelengths (e.g., LED peak wavelengths that differ from one another by one of the following wavelength thresholds: at least 5 nm, at least 10 nm, at least 15 nm, at least 20 nm, at least 25 nm, at least 30 nm, at least 35 nm, and at least 40 nm), and/or yellow lumiphors with different peak wavelengths (e.g., lumiphor peak wavelengths that differ from one another by one of the following wavelength thresholds: at least 5 nm, at least 10 nm, at least 15 nm, at least 20 nm, at least 25 nm, at least 30 nm, at least 35 nm, and at least 40 nm).

In certain embodiments, a lighting device (e.g., solid state emitter package) includes at least one BSY or white emitter component (including a blue solid state emitter arranged to stimulate emissions of a yellow lumiphor) in combination with separately controllable blue, green, and red emitters (e.g., blue, green, or red LEDs, or individual LED chips arranged to stimulate emissions of blue, green, and red lumiphors, respectively). The combined presence of the red, blue, green, and white components is useful to improve color rendering, with the resulting combination being termed "RGBW" (red-green-blue-white). Separate controllability of the red, green, blue, and white emitters is useful for adjustment of color and/or chromaticity of the lighting device, and to promote improved color rendering.

Certain embodiments of the present invention may involve use of solid state emitter packages. A solid state emitter package typically includes at least one solid state emitter chip (more preferably multiple solid state emitter chips) that is enclosed with packaging elements to provide environmental protection, mechanical protection, color selection, and/or light focusing utility, as well as electrical leads, contacts, and/or traces enabling electrical connection to an external circuit. One or more emitter chips may be arranged to stimulate one or more lumiphoric materials, which may be coated on, arranged over, or otherwise disposed in light receiving relationship to one or more solid state emitters. A lens and/or encapsulant materials, optionally including lumiphoric material, may be disposed over solid state emitters, lumiphoric materials, and/or lumiphor-containing layers in a solid state emitter package. Multiple solid state emitters may be provided in a single package. A package including multiple solid state emitters may include multiple die attach pads, with a single die attach pad supporting each separately controllable solid state emitter or each separately controllable group of solid state emitters. A package including multiple solid state emitters may include a single lens arranged to transmit at least a portion of light emanating from each solid state emitter. In certain embodiments, a package includes a molded lens arranged to transmit light emitted by multiple LEDs. As known in the art, a mold including one or more cavities can be arranged over a substrate (or a panel of substrate material, from which multiple substrates may be singulated by sawing or other means) and LED chips arranged thereon, with the mold comprising a lens material and/or encapsulant in liquid form. In certain embodiments, a lens may be formed of liquid curable silicone, and LED chips may be embedded in liquid silicone, which is subsequently cured to form one or more lenses. Alternatively, a lens may be pre-molded and then affixed (e.g., with adhesives, thermal bonding, or any other suitable joining method) to a subassembly including a substrate with multiple LED chips mounted on or over the substrate. In certain embodiments, a molded lens may be arranged in direct contact with LED chips, die attach pads, other electrical elements, and/or exposed insulating material along a top surface of a substrate comprising insulating material.

In certain embodiments, a lens may be molded using conventional techniques, and the lens may include any suitable shape depending on the desired light output pattern. One suitable lens shape is hemispheric, with some examples of alternative shapes being ellipsoid bullet, flat, hex-shaped and square. Various that could be used for lenses, such as silicones, plastics, epoxies, or glass, with preferred lens materials being compatible with molding processes. Silicone is suitable for molding and provides suitable optical transmission properties. It can also withstand subsequent reflow processes and does not significantly degrade over time. In certain embodiments, a lens may be textured or faceted to improve light extraction, and/or a lens may contain or have coated thereon various materials such as lumiphors and/or scattering particles.

In certain embodiments, a solid state emitter package includes a substrate (also known as a 'submount') comprising (or consisting essentially of) electrically insulating material with multiple LED die attach pads and electrical elements arranged on or in a top surface of the substrate, multiple anodes and cathodes arranged on or in a bottom surface of the substrate, and multiple electrically conductive vias defined through the substrate to provide conductive electrical paths between structures on the top and bottom surfaces. In certain embodiments, each LED die attach pad includes one or more LED chips mounted thereon. A first LED chip or group of LED chips may be arranged in conductive electrical communication with a first anode/cathode pair by way of a first pair of electrically conductive vias, and a second LED chip or group of LED chips may be arranged in conductive electrical communication with a second anode/cathode pair by way of a second pair of electrically conductive vias, with the first LED chip or group of LED chips being separately controllable from the second LED chip or group of LED chips.

Examples of electrically insulating substrate materials include, but are not limited to, ceramic materials (e.g., aluminum oxide, aluminum nitride, or zinc oxide), organic insulators (e.g., polyimide (PI) or polyphthalamide (PPA)), printed circuit board (PCB) material (e.g., FR-4 PCB, metal core PCB, or other PCB types), crystalline materials (e.g., sapphire or silicon), or any other suitable material, such as T-Clad thermal clad insulated substrate material, available from The Bergquist Company of Chanhassen, Minn. In various embodiments, desirable substrates may comprise materials constituting good electrical insulators with low thermal resistance or high thermal conductivity (e.g., AlN). Some materials that may be used have a thermal conductivity of approximately 30 W/mK or higher, such as zinc oxide (ZnO). Other acceptable materials have thermal conductivities of approximately 120 W/mK or higher, such as aluminum nitride (AlN) which has a thermal conductivity that can range from 140 to 180 W/mK. In terms of thermal resistance, some acceptable substrate materials have a thermal resistance of 2° C./W or lower. Other substrate materials having thermal characteristics outside the ranges discussed herein may also be used.

LED die attach pads and electrical elements arranged in or on the top surface of a substrate, and anodes and cathodes arranged (e.g., patterned) in or on the bottom surface of a substrate, may include any suitable electrically and/or thermally conducting materials. In certain embodiments, such structures copper deposited using known techniques such as plating. In typical plating processes, a titanium adhesion layer and copper seed layer are sequentially sputtered onto a substrate. Then, a thicker layer (e.g., approximately 75 microns) of copper can be plated onto the copper seed layer. The resulting copper layer being deposited can then be patterned using standard lithographic processes to form individual traces that may be separated by gaps (e.g., extending to an adjacent top or bottom surface of a substrate) to promote electrical and thermal isolation adjacent traces. In other embodiments, one or more layers of conductive material can be sputtered using a mask to form the desired pattern. In certain embodiments, conductive materials used for die attach pads, electrical elements, anodes, and cathodes may each comprise copper, or one or more of such features may comprise different conductive materials. For example, die attach pads can be plated or coated with additional metals or materials (e.g., adhesive or bonding materials, reflective layers, and/or barrier layers) to the make such die attach pads more suitable for mounting LEDs.

Conductive material patterned on or over a top surface of an insulating substrate may not only provide electrical connections to solid state emitter chips, but also facilitate spreading of heat generated by the solid state emitter chips. When one or more LED chips are provided over a die attach pad, heat can become generally concentrated in insulating substrate in an the area just below the LED chip(s), and can lead to overheating of the LEDs which in turn limits the operating power level of the lighting device. To improve dissipation of heat from LED chips, conductive traces (e.g., including die attach pads and additional and electrical elements) can provide extending thermally conductive paths to conduct heat away from the LED chips to avoid concentration of heat in the substrate just below the LEDs. For example, die attach pads can cover a greater area of the top surface of a substrate than the aggregate footprint of any LED chips mounted thereon, with die attach pads preferably extending outward (e.g., radially outward) toward edges of the substrate. Die attach pads and additional electrical elements may comprise any suitable shape and/or size, and in some embodiments may extend to or substantially to one or more edges of a substrate. Die attach pads and additional electrical elements may cover different percentages of a top surface of a substrate, such as at least about 50% of the top surface area, at least about 70% of the top surface area, or at least about 75% of the top surface area in various embodiments.

In certain embodiments, an optional solder mask comprising conventional materials may be provided over portions of a conductive pattern and a top surface of a substrate. Solder masks and deposition methods are described in U.S. patent application Ser. No. 12/757,891, which is herein incorporated by reference herein. A solder mask may cover portions of die attach pads, electrical elements, and/or gaps formed on or over the top surface of a substrate, with the solder mask being useful to protect these features during subsequent processing steps, including mounting of LEDs to die attach pads and wire bonding. During these steps there may be a danger of solder or other materials being deposited in undesired areas, thereby resulting in damage and/or electrical shorting. A solder mask can provide an insulating and protective material that can reduce or prevent these dangers. A solder mask may include one or more openings for mounting over die attach pads and for attaching wire bonds to electrical elements along the top surface of a substrate. A solder mask may further include alignment holes that promote alignment during fabrication of LED devices and/or promote alignment when a lighting device is mounted by an end user.

In certain embodiments, a solid state emitter package includes a solid state emitter package includes an electrically insulating substrate (also known as a 'submount') with multiple LED die attach pads and electrical elements arranged on or in a top surface of the substrate, multiple anodes and cathodes arranged on or in a bottom surface of the substrate, multiple electrically conductive vias defined through the substrate to provide conductive electrical paths between structures on the top and bottom surfaces, and at least one exposed anode contact and/or exposed cathode contact along the top surface. Multiple exposed anode contact and/or exposed cathode contact may be provided along the top surface. In certain embodiments, the top surface anode and cathode contacts may be arranged in conductive electrical communication with at least some bottom surface anodes and/or cathodes, thereby providing enhanced flexibility for establishing electrical connections to emitters of the solid state emitter package. In other embodiments, top surface anode and cathode contacts may not be in conductive electrical communication with any bottom surface anodes and/or cathodes. Various combinations of multiple LED chips or groups of LED chips may be in conductive electrical communication with one or more anode/cathode pairs along the bottom surface of a substrate, while the same or different combinations of multiple LED chips or groups of LED chips may be in conductive electrical communication with one or more anode contact/cathode contact pairs along the top surface of a substrate. Where one or more top surface anode and/or cathode contacts are provided, such contacts are preferably devoid of solder mask material, such as by lack of presence of any solder mask applied over a top surface of the package, or by patterning or selective deposition of a solder mask to expose any desired top surface contact regions.

In certain embodiments, a solid state emitter package as disclosed herein may include a thermal element (e.g., thermal spreading element) on or along a bottom surface (opposing a top surface having LED chips arranged thereon) of an insulating substrate. LED chips. A thermal element may include any suitable thermally conductive material. In certain embodiments, a thermal element may be arranged in at least partial vertical alignment with LEDs arranged along a top surface of a substrate. In certain embodiments, a thermal element may be electrically isolated from any elements in conductive thermal communication with LEDs of a LED device. Although heat from LED chips can laterally spread over a top surface of a substrate by way of die attach pads and additional electrical elements patterned thereon, in certain embodiments more heat can pass into the substrate directly below and around the LED chips. A thermal element can assist with heat dissipation and transfer to a surrounding structure (e.g., external heatsink) or environment. Heat can also be conducted from a top surface of a substrate through conductive vias arranged in electrical communication with anodes and cathodes arranged along a bottom surface of the substrate. For surface mount devices according to certain embodiments, the thickness of thermal element may be approximately the same as anode and cathode structures arranged along a bottom surface of a substrate. In other embodiments, to improve solder wetting, and to ensure a more robust contact between a thermal element and an external heat sink, a thermal element be thicker than, and may extend or protrude downward from a bottom surface of a substrate farther than, bottom surface anode and cathode contacts.

Lighting devices as disclosed herein may include solid state emitters or groups of solid state emitters configured in various arrangements depending upon the application and/or voltage range desired. In certain embodiments, separately controllable solid stage emitters or groups of solid state emitters may be configured to operate at different voltages. Examples of possible operating voltages include, but are not limited to, 3V, 6V, and 12V. In certain embodiments, a lighting device may include multiple strings of LED chips, with each string arranged to be separately controlled. Different strings of LEDs may include LED chips arranged in series, arranged in parallel, or arranged in series/parallel configurations (e.g., with sub-strings of LEDs arranged in series, and multiple sub-strings arranged in parallel).

Devices according to the present invention may be used as described in U.S. Pat. No. 7,213,940, which is hereby incorporated by reference as if set forth fully herein. A combination of light (aggregated emissions) exiting a solid state emitter package as disclosed herein, may, in an absence of any additional light, produce a mixture of light having x, y color coordinates within an area on a 1931 CIE Chromaticity Diagram defined by points having coordinates (0.32, 0.40), (0.36, 0.48), (0.43, 0.45), (0.42, 0.42), (0.36, 0.38). A combination of light (aggregated emissions) exiting a solid state emitter package as disclosed herein, may, in an absence of any additional light, produce a mixture of light having x, y color coordinates that define a point preferably within four (more preferably within three, still more preferably within two) MacAdam ellipses of a reference point on the blackbody locus of a 1931 CIE Chromaticity Diagram. In certain embodiments, such a reference point on the blackbody locus may have a color temperature of preferably less than or equal to 5000 K, more preferably less than or equal to 4000 K, more preferably less than or equal to 3500 K, or more preferably less than or equal to 3000 K. In certain embodiments, combined emissions from a lighting device embody at least one of (a) a color rendering index (CRI Ra) value of at least 85, and (b) a color quality scale (CQS) value of at least 85.

Individual emitters in a solid state emitter package, or groups of emitters (e.g., wired in series and/or in parallel) in a solid state emitter package, may be separately controlled. Multiple solid state emitter packages may be arranged in a single solid state lighting device. Individual solid state emitter packages or groups of solid state emitter packages (e.g., wired in series and/or in parallel) may be separately controlled. Separate control of individual emitters, groups of emitters, individual packages, or groups of packages, may be provided by independently applying drive currents to the relevant components with control elements known to those skilled in the art. In one embodiment, at least one control circuit a may include a current supply circuit configured to independently apply an on-state drive current to each individual solid state emitter, group of solid state emitters, individual solid state emitter package, or group of solid state emitter packages. In certain embodiments, drive currents may be pulsed, such as with pulse width modulation. Control of one or more solid state emitters may be responsive to a control signal (optionally including at least one sensor arranged to sense electrical, optical, and/or thermal properties and/or environmental conditions), and a control system may be configured to selectively provide one or more control signals to at least one current supply circuit. In various embodiments, current to different circuits or circuit portions may be pre-set, user-defined, or responsive to one or more inputs or other control parameters.

Certain embodiments of the present invention further relate to the use of light fixtures include multiple electrically activated (e.g., solid state) emitters as disclosed herein. One or more solid state emitter packages may be arranged on a single substrate, mounting plate, or other mounting element whether individually or as part of multi-chip packages or other multi-chip lamps. Any desirable number of electrically activated emitter packages and/or other emitters may be incorporated into a light fixture. Each electrically activated emitter or emitter-containing package in a single fixture may be substantially identical to one another, or emitters (or emitter-containing packages) with different output characteristics may be intentionally provided in a single light fixture. A light fixture may include one or more control circuits arranged in electrical communication with electrically activated emitters and/or emitter packages contained in or supported by the fixture.

In one embodiment, a light emitting diode (LED) device includes: an insulating substrate (e.g., ceramic) including a top surface, a bottom surface, and at least one side wall extending between the top surface and the bottom surface; a plurality of LEDs mounted on or over the top surface; and a plurality of anodes and a plurality of cathodes arranged on the bottom surface and in conductive electrical communication with the plurality of LEDs; wherein at least a first LED of the plurality of LEDs is in conductive electrical communication with a first anode of the plurality of anodes and with a first cathode of the plurality of cathodes; and wherein at least a second LED of the plurality of LEDs is in conductive electrical communication with a second anode of the plurality of anodes and with a second cathode of the plurality of cathodes. Preferably, the LED device is devoid of any anode or cathode arranged on, or extending laterally beyond, any side wall of the LED device. A plurality of electrically conductive vias may be defined in the substrate between the top surface and the bottom surface, wherein each via of the plurality of vias is in conductive electrical communication with (i) at least one LED of the plurality of LEDs, and (ii) either a different anode of the plurality of anodes or a different cathode of the plurality of cathodes. The plurality of anodes and the plurality of cathodes may comprise electrically conductive material patterned in or on the bottom surface. A plurality of electrically conductive die attach pads may be arranged between the plurality of LEDs and the top surface, and may be formed as electrically conductive traces. A thermally conductive heat spreader (preferably electrically isolated from the plurality of LEDs) may be arranged in conductive thermal communication between the plurality of LEDs and the bottom surface.

Various combinations of solid state emitter elements (e.g., LEDs) and/or lumiphoric elements may be provided. In certain embodiments, at least a first LED comprises a first peak wavelength, the at least a second LED comprises a second peak wavelength, and the second peak wavelength differs from the first peak wavelength by at least 30 nm. In certain embodiments, at least a first LED comprises at least one LED comprising a first polarity, and at least a second LED comprises at least one LED comprising a second polarity that is opposite the first polarity. In certain embodiments, at least a first LED comprises at least one LED comprising a peak wavelength in a range of from 430 nm to 480 nm (e.g., including blue) and arranged to stimulate at least one lumiphor comprising a peak wavelength in a range of from 500 nm to 560 nm (e.g., including yellow), and at least a second LED comprises at least one LED comprising a peak wavelength in a range of from 600 nm to 660 nm (e.g., including red). In certain embodiments, at least a first LED comprises at least one LED arranged to stimulate at least one first lumiphor, and at least a second LED comprises at least one LED arranged to stimulate at least one second lumiphor.

In certain embodiments, aggregated emissions exiting a LED device produce, in the absence of any additional light, a mixture of light having x, y color coordinates within an area on a 1931 CIE Chromaticity Diagram defined by points having coordinates (0.32, 0.40), (0.36, 0.48), (0.43, 0.45), (0.42, 0.42), (0.36, 0.38). In certain embodiments, aggregated emissions exiting a LED device produce, in the absence of any additional light, a mixture of light having x, y color coordinates within four MacAdam ellipses of a reference point on the blackbody locus of a 1931 CIE Chromaticity Diagram. In certain embodiments, aggregated emissions exiting a LED device embody at least one of (a) a color rendering index (CRI Ra) value of at least 85, and (b) a color quality scale (CQS) value of at least 85.

In certain embodiments, a first electrostatic discharge protection element may be in conductive electrical communication with the first anode and the first cathode, and second electrostatic discharge protection element may be in conductive electrical communication with the second anode and the second cathode.

In certain embodiments, a multi-emitter solid state lighting device (e.g., LED package) may have a small footprint or form factor, such as less than 5 cm$^2$, less than 3 cm$^2$, less than 2 cm$^2$, less than 1 cm$^2$, less than 0.5 cm$^2$, less than 0.3 cm$^2$, or less than 0.25 cm$^2$. LED chips of any suitable size or form factor may be included in a multi-emitter lighting device, including chips having a width of up to about 2000 microns, up to about 1000 microns, up to about 500 microns, up to about 350 microns, or any other suitable size.

In certain embodiments, a light emitting diode (LED) device comprises: an insulating substrate including a top surface, a bottom surface, and at least one side wall extending between the top surface and the bottom surface; a plurality of die attach pads patterned in or on the top surface; a plurality of LEDs mounted to the plurality of die attach pads; and a plurality of electrically conductive vias defined in the substrate between the top surface and the bottom surface; wherein at least a first LED of the plurality of LEDs is in conductive electrical communication with a first pair of vias of the plurality of vias; and wherein at least a second LED of the plurality of LEDs is in conductive electrical communication with a second pair of vias of the plurality of vias that differs from the first pair of vias. A plurality of anodes and a plurality of cathodes may be arranged on the bottom surface and in conductive electrical communication with the plurality of vias, wherein the plurality of anodes and the plurality of cathodes includes (i) a first anode/cathode pair in conductive electrical communication with the first pair of vias, and (ii) a second anode/cathode pair in conductive electrical communication with the second pair of vias. In certain embodiments, the plurality of anodes and the plurality of cathodes comprise conductive material patterned in or on the bottom surface. At least a first LED and the at least a second LED may be independently controllable using the first anode/cathode pair and the second anode/cathode pair. In certain embodiments, any combination of LEDs or groups of LEDs as disclosed herein may be provided.

In certain embodiments, a light emitting diode (LED) device comprises: a plurality of LEDs mounted on or over a top surface of an insulating substrate comprising a ceramic material; a molded lens arranged over the plurality of LEDs and arranged to transmit light generated by the LEDs; a plurality of anodes and a plurality of cathodes in conductive electrical communication with the plurality of LEDs; wherein at least two LEDs of the plurality of LEDs are independently controllable using the plurality of anodes and the plurality of cathodes. In certain embodiments, an insulating substrate includes a bottom surface and at least one side wall extending between the top surface and the bottom surface, wherein the plurality of anodes and the plurality of cathodes are arranged on the bottom surface. A plurality of electrically conductive vias may be defined in the substrate between the top surface and the bottom surface, wherein each via of the plurality of vias is in conductive electrical communication with (i) at least one LED of the plurality of LEDs, and (ii) either a different anode of the plurality of anodes or a different cathode of the plurality of cathodes. In certain embodiments, at least a first LED may be in conductive electrical communication with a first anode and with a first cathode, and at least a second LED is in conductive electrical communication with a second anode and with a second cathode. In certain embodiments, at least a first LED may include multiple first LEDs, and/or at least a second LED may include multiple second LEDs.

In certain embodiments, a light emitting diode (LED) device includes: an insulating substrate including a top surface and a plurality of conductive traces patterned on or over the top surface; a plurality of LEDs mounted on or over the top surface and in conductive electrical communication with the plurality of conductive traces, wherein the plurality of LEDs comprises (i) a first blue LED arranged to stimulate emissions of a first yellow lumiphor disposed on the first blue LED, (ii) a second blue LED arranged to stimulate emissions of a second yellow lumiphor disposed on the second blue LED, and (iii) a red LED; and a plurality of anodes and a plurality of cathodes arranged in conductive electrical communication with the plurality of conductive traces and the plurality of LEDs; wherein each of the first blue LED, the second blue LED, and the red LED is independently controllable. In certain embodiments, the substrate includes a bottom surface and at least one side wall extending between the top surface and the bottom surface, wherein the plurality of anodes and the plurality of cathodes comprise electrically conductive traces arranged on or in the bottom surface. In certain embodiments, a plurality of electrically conductive vias may be defined in the substrate between the top surface and the bottom surface, wherein each via of the plurality of vias is in conductive electrical communication with (i) at least one LED of the plurality of LEDs, and (ii) either a different anode of the plurality of anodes or a different cathode of the plurality of cathodes In certain embodiments, a light emitting diode (LED) device includes: an insulating substrate including a top surface and a plurality of conductive traces patterned on or over the top surface; a plurality of LEDs mounted on or over the top surface and in conductive electrical communication with the plurality of conductive traces, wherein the plurality of LEDs comprises a first LED comprising a first peak wavelength, a second LED comprising a second peak wavelength, and a third LED comprising a third peak wavelength; and a plurality of anodes and a plurality of cathodes arranged in conductive electrical communication with the plurality of conductive traces and the plurality of LEDs; wherein each of the first LED, the second LED, and the third LED is independently controllable; wherein the first peak wavelength and the second peak wavelength are substantially the same or differ from one another by less than 20 nm (or another first threshold as disclosed herein); and wherein the third peak wavelength differs from each of the first peak wavelength and the second peak wavelength by at least 40 nm (or another second threshold as disclosed herein). In certain embodiments, the substrate includes a bottom surface and at least one side wall extending between the top surface and the bottom surface, wherein the plurality of anodes and the plurality of cathodes comprise electrically conductive traces arranged on or in the bottom surface. In certain embodiments, a plurality of electrically conductive vias may be defined in the substrate between the top surface and the bottom surface, wherein each via of the plurality of vias is in conductive electrical communication with (i) at least one LED of the plurality of LEDs, and (ii) either a different anode of the plurality of anodes or a different cathode of the plurality of cathodes. In certain embodiments, the first peak wavelength and the second peak wavelength are substantially the same or differ from one another by less than 5 nm.

Various illustrative features are described below in connection with the accompanying figures.

FIG. 1A illustrates a solid state emitter package 100 according to one embodiment. The emitter package 100 includes multiple (e.g., four) LED chips 150A-150D supported by an insulating substrate 110 (e.g., preferably, but not necessarily. comprising ceramic material) having an upper surface 111, a lower surface 112, and side walls 113-116 extending between the upper surface 111 and the lower surface 112. Electrical traces 140 are arranged over the substrate 110, including multiple die attach pads 141A-141D and additional electrical elements 142A-142D arranged proximate to the die attach pads 141A-141D. Where the die attach pads 141A-141D are electrically conductive, the LED chips 150A-150D may be arranged with bottom side contacts thereof in electrical communication with the die attach pads 141A-141D, and with top side contacts thereof in electrical communication with the electrical elements 142A-142D by way of wirebonds 152. The die attach pads 141A-141D and electrical elements 142A-142D may comprise one or more metals patterned on (or in) the top surface 111 of the substrate 110. Gaps 145 may be provided between adjacent die attach pads 141A-141D and/or electrical elements 142A-142D to prevent undesired conductive electrical communication. It is to be appreciated that die attach pads need not be electrically conductive, such as in cases where anode and cathode connections to a solid state emitter chip are both made with wirebonds. Optional elements that may be formed concurrently with the electrical traces 140 but not serve as part of any conductive path through the package 100 include a polarity or positional identifying mark 148 and chip singulation alignment marks 149-1, 149-2 (used during singulation, such as by sawing, of emitter packages or subassemblies thereof from a wafer or superassembly from which multiple emitter packages are formed). An insulating soldermask 147 (shown in greater detail in FIG. 1B) is patterned over peripheral portions of the electrical traces 140, and a molded lens 160 (e.g., including a raised or hemispherical portion 161 and a base portion 162) is arranged over the top surface 111 of the substrate 110 and is arranged to transmit at least a portion of light generated by the emitter chips 150A-150D.

FIG. 1B is a top plan view of a first subassembly 100-3 of the emitter package 100 illustrated in FIG. 1A, with the subassembly 100-3 lacking the lens 160 and representing the solder mask 147 with hatched lines for emphasis. As shown in FIG. 1B, the solder mask 147 is arranged over peripheral portions of the top side electrical traces 140 between the substrate edges 113-116 and a roughly circular window arranged below a raised portion 161 of the lens 160.

FIG. 1C is a top plan view of a second subassembly 100-1 of the emitter package 100 illustrated in FIG. 1A, with the subassembly 100-1 lacking a lens, solder mask, and LEDs, but with the traces 140 represented with hatched lines for emphasis. As shown in FIG. 1C, the electrical traces 140 extend peripherally outward beyond the roughly circular window defined in the solider mask 147 (illustrated in FIG. 1B), with optional alignment holes 143A-143D defined in peripheral portions of the die attach pads 141A-141D, and optional alignment holes 144A-144D defined in peripheral portions of the additional electrical elements 142A-142D. The various alignment holes 143A-143D, 144A-144D may be used during manufacture, for example, to promote alignment with electrically conductive vias (e.g., as shown in FIG. 1G) defined through the insulating substrate 110.

FIG. 1D is a top plan view of a third subassembly 100-2 of the emitter package 100 illustrated in FIG. 1A, with the subassembly 100-2 lacking a lens, and LEDs, but with the solder mask 147 represented with hatched lines for emphasis FIG. 1E is a bottom plan view of each of the emitter package 100 of FIG. 1A and the subassemblies of FIGS. 1B, 1C, and 1D. A bottom surface 112 of the substrate includes four anodes 121A-121D and four cathodes 122A-122D patterned thereon (e.g., as electrical traces), with one paired anode/cathode per quadrant. Each anode 121A-121D may include an optional alignment hole 123A-123D and each cathode 122A-122D may include an optional alignment hole 124A-124D. The various anodes 121A-121D and cathodes 122A-122D are separated by gaps that may be filled with solder mask material sections 127-1, 127-2. A thermal element (e.g., thermal spreading element) 126 may be arranged along the bottom surface 112 between the solder mask material sections 127-1, 127-2 and generally underlapping the solid state emitters 150A-150D. The thickness of the thermal element 126 may be the same as or different from (e.g., thicker than) the anodes 121A-121D and cathodes 122A-122D. As show, the device 100 is devoid of any anode or cathode arranged on, or extending laterally beyond, any side wall 113-116 of the LED device 100.

FIG. 1F is a right side elevation view of the first subassembly 100-3 illustrated FIG. 1B, being devoid of a lens but showing solid state emitter chips 150B, 150D and wirebonds 152 arranged over a top surface 111 of the substrate 110.

FIG. 1G is a side cross-sectional view of the third subassembly 100-2 of FIG. 1D, taken along section lines "A"-"A" depicted in FIG. 1E. FIG. 1G illustrates electrically vias 125C, 125D defined through the substrate 110 between the top and bottom surfaces 111, 112, and arranged to provide electrical communication between top side traces (die attach pads) 141C, 14D and bottom side traces (anodes) 121C, 121D. The thermal element 112 is further illustrated along the bottom surface 112 of the substrate 110. As shown in FIG. 1G, the upper solder mask 147 may extend laterally past the top side traces 140 but not quite to side edges 113, 115 of the substrate 110.

Figure 1I:
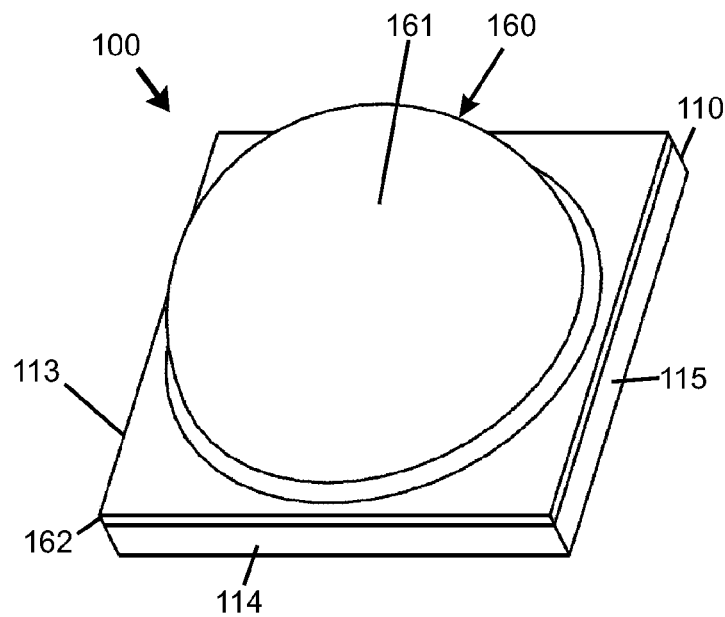
FIG. 1I is a second perspective view of the emitter package of FIG. 1A.

FIG. 1H is an exploded right side elevation view of the emitter package 100, separately depicting the lens 160 registered with the first subassembly 100-3 of FIG. 1B. FIG. 1I is another perspective view of the emitter package 100. Although FIGS. 1H-1I illustrate the lens 160 as including a hemispherical central raised portion 161, it is to be appreciated that any suitable lens shape (including raised, flat, or recessed shapes) may be provided in various embodiments. The lens 160 is preferably molded and may either be molded in place over the emitter chips 150A-150D and substrate 110, or may be pre-molded and then affixed to a subassembly including the substrate 110 and emitter chips 150A-150D.

FIG. 2A illustrates a solid state emitter package 200 according to another embodiment that is highly similar to the emitter package 100, but with reversed polarity in the third quadrant (e.g., to accommodate a reverse polarity solid state emitter chip such as a red LED). The emitter package 200 includes multiple (e.g., four) LED chips 250A-250D supported by an insulating substrate 210 (e.g., preferably, but not necessarily, comprising ceramic material) having an upper surface 211, a lower surface 212, and side walls 213-216 extending between the upper surface 211 and the lower surface 212. Electrical traces 240 are arranged over the substrate 210, including multiple die attach pads 241A-241D and additional electrical elements 242A-242D arranged proximate to the die attach pads 241A-241D. The die attach pads 241A-241D and electrical elements 242A-242D may comprise one or more metals patterned on (or in) the upper surface 211 of the substrate 210. Wirebonds 252 may promote electrical communication with the LED chips 250A-250D. Gaps 245 may be provided between adjacent die attach pads 241A-241D and/or electrical elements 242A-242D to prevent undesired conductive electrical communication therebetween. Optional elements that may be formed concurrently with the electrical traces 240 but not serve as part of any conductive path through the package 200 include a polarity or positional identifying mark 248 and chip singulation alignment marks 249-1, 249-2. An insulating soldermask 247 (shown in greater detail in FIG. 2B) is patterned over peripheral portions of the electrical traces 240, and a molded lens 260 (e.g., including a raised or hemispherical portion 261 and a base portion 262) is arranged over the upper surface 211 of the substrate 210 and is arranged to transmit at least a portion of light generated by the LED chips 250A-250D. The emitter package 200 shown in FIG. 2A differs from the emitter package 100 described previously in the third (lower left) quadrant, with the die attach pad 241C providing opposite polarity to the other die attach pads 241A, 241B, 241D.

FIG. 2B is a top plan view of a first subassembly 200-3 of the emitter package 200 illustrated in FIG. 2A, with the subassembly 200-3 lacking the lens 260 and representing the solder mask 247 with hatched lines for emphasis. As shown in FIG. 2B, the solder mask 247 is arranged over peripheral portions of the top side electrical traces 240 between the substrate edges 213-216 and a roughly circular window arranged below a raised portion 261 of the lens 260.

Figure 2C:
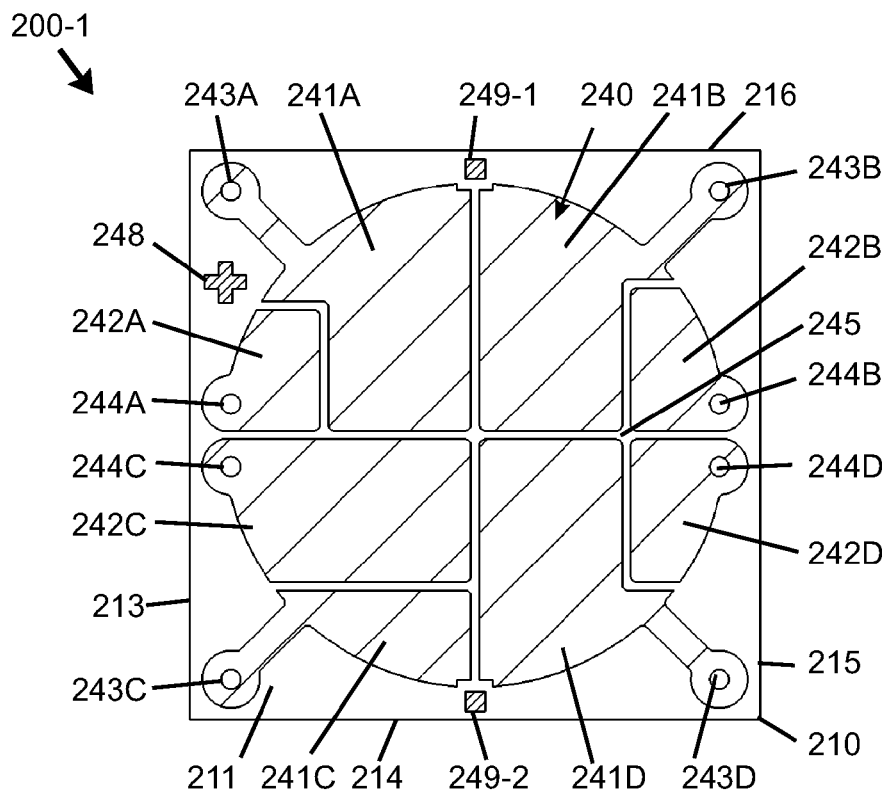
FIG. 2C is a top plan view of a second subassembly of the emitter package of FIG. 2A, lacking a lens, soldermask material, and LEDs.

FIG. 2C is a top plan view of a second subassembly 200-2 of the emitter package 200 illustrated in FIG. 2A, with the subassembly 200-2 lacking a lens, solder mask, and LEDs, but with the traces 240 represented with hatched lines for emphasis. As shown in FIG. 2C, the electrical traces 240 extend peripherally outward beyond the roughly circular window defined in the solider mask 247 (illustrated in FIG. 2B), with optional alignment holes 243A-243D defined in peripheral portions of the die attach pads 241A-241D, and optional alignment holes 244A-244D defined in peripheral portions of the additional electrical elements 242A-242D. The various alignment holes 243A-243D, 244A-244D may be used during manufacture, for example, to promote alignment with electrically conductive vias (e.g., as shown in FIG. 2G) defined through the insulating substrate 210.

Figure 2D:
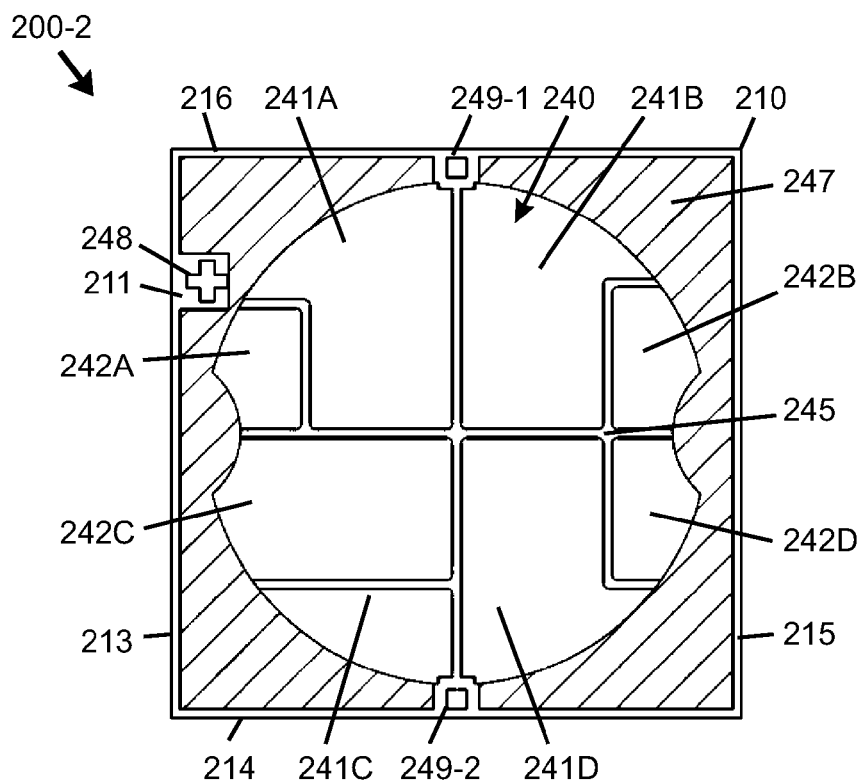
FIG. 2D is a top plan view of a third subassembly of the emitter package of FIG. 2A, lacking a lens and LEDs.

FIG. 2D is a top plan view of a third subassembly 200-2 of the emitter package 200 illustrated in FIG. 2A, with the subassembly 200-2 lacking a lens, and LEDs, but with the solder mask 247 represented with hatched lines for emphasis FIG. 2E is a bottom plan view of each of the emitter package 200 of FIG. 2A and the subassemblies of FIGS. 2B, 2C, and 2D. A bottom surface 212 of the substrate includes four anodes 221A-221D and four cathodes 222A-222D patterned thereon (e.g., as electrical traces), with one paired anode/cathode per quadrant. Each anode 221A-221D may include an optional alignment hole 223A-223D and each cathode 222A-222D may include an optional alignment hole 224A-224D. The various anodes 221A-221D and cathodes 222A-222D are separated by gaps that may be filled with solder mask material sections 227-2, 227-2. A thermal element (e.g., thermal spreading element) 226 may be arranged along the bottom surface 212 between the solder mask material sections 227-2, 227-2 and generally underlapping the solid state emitters 250A-250D. The thickness of the thermal element 226 may be the same as or different from (e.g., thicker than) the anodes 221A-221D and cathodes 222A-222D. As show, the device 200 is devoid of any anode or cathode arranged on, or extending laterally beyond, any side wall 213-216 of the LED device 200.

FIG. 2F is another perspective view of the emitter package 200. Although FIGS. 2A and 2F illustrate the lens 260 as including a hemispherical central raised portion 261, it is to be appreciated that any suitable lens shape (including raised, flat, or recessed shapes) may be provided in various embodiments. The lens 260 is preferably molded and may either be molded in place over the emitter chips 250A-250D and substrate 210, or may be pre-molded and then affixed to a subassembly including the substrate 210 and emitter chips 250A-250D.

Although four separately controllable individual emitter chips were illustrated in connection with FIGS. 1A to 2F, it is to be appreciated that any desirable number of emitter chips may be grouped in a solid state lighting device (e.g., solid state emitter package) with various groups being separately controllable from one another.

FIG. 3 is a schematic top view of a solid state lighting device (e.g., emitter package) 300 including a single emitter chip 350A and multiple emitter groups 351B, 351C, 351D, wherein each of single emitter chip 350A and multiple emitter groups 351B, 351C, 351D is independently controllable relative to the other (e.g., using a separate anode/cathode pair (not shown) for the single emitter chip 350A and each of the multiple emitter groups 351B, 351C, 351D). As illustrated, the first emitter group 351B includes two emitter chips 350B-1, 350B-2; the second emitter group 351B includes three emitter chips 350C-1 to 350C-3; and the third emitter group 351C includes four emitter chips 350D-1 to 350D-4; however, it is to be appreciated that each emitter group 351B, 351C, 351D may include any suitable number of emitter chips. Within each emitter group 351B, 351C, 351D, solid state emitter chips of the same or different peak wavelengths may be provided. In certain embodiments, a separately controllable group of LEDs includes (i) an LED comprising a first peak wavelength and (ii) an other LED comprising a second peak wavelength, and the second peak wavelength differs from the first peak wavelength by at least 30 nm.

FIG. 4 is a schematic diagram showing electrical connections between various elements of a solid state emitter device (e.g., emitter package) 400 according to one embodiment including a substrate 410 having arranged thereon a first group of solid state emitters 450A-1, 450A-2 and a second group of solid state emitters 450B-1, 450B-2 that are independently controllable using a first paired anode 421A and cathode 422A for the first group and a second paired anode 421B and cathode 422B for the second group. (Although each group is illustrated as having two emitters, it is to be appreciated that any number of one, two, three, four, five, or more solid state emitters may be provided in each group.) If the anodes 421A-421B and cathodes 422A-422B are arranged on an opposite surface of the substrate 410 than the solid state emitters 450A-1, 450A-2, 450B-1, 450B-2, then electrically conductive vias 425A, 425B, 429A, 429B may be provided. Electrically conductive traces 441A, 441B, 442A, 442B are preferably arranged on or in the substrate 410 to provide electrical communication with the solid state emitter chips 450A-1, 450A-2, 450B-1, 450B-2 (optionally in conjunction with wirebonds, depending on the type an configuration of the emitter chips). Each group of solid state emitter chips preferably has associated therewith at least one electrostatic discharge protection element 455A-455B (e.g., including, but not limited to, vertical silicon (Si) Zener diodes, different LEDs arranged in parallel and reverse biased to the LEDs 450A-1, 450A-2, 450B-1, 450B-2, surface mount varistors and lateral Si diodes). In operation of the solid state emitter device 400, current is separately applied between the respective first paired anode 421A and cathode 422A and the second paired anode 421B and cathode 422B. Referring to the first emitter group, current travels from the anode 421A, a conductive via 425A, and electrical trace 441A to the solid state emitters 450A-1, 450A-2, which emit light. Flow of current through the circuit continues through a further electrical trace 442A and conductive via 429A to the cathode 422A. Although the emitter chips 450A-1, 450A-2 are illustrated as being in parallel, it is to be appreciated that any number of emitter chips within the same group may be provided any suitable series, parallel, or series/parallel arrangement. Current flows similarly through the corresponding circuit including the second group of solid state emitter chips 450B-1, 450B-2. Although only two groups of emitter chips are illustrated in FIG. 4, it is to be appreciated that any desirable number of two, three, four, five, six, or more groups of one or more emitter chips may be provided and separately controlled.

Although FIGS. 1A-2F illustrated devices 100, 200 with quadrant-specific anode/cathode pairs (i.e., corresponding anode/cathode pairs arranged in different quadrants of a lighting device), in certain embodiments, anodes and cathodes may be arranged along opposing ends of one surface of a multi-chip emitter device (e.g., solid state emitter package).

FIG. 5 is a schematic diagram showing electrical connections between various elements of a multi-emitter solid state emitter package 500 according to one embodiment including an insulating substrate 510 with four sides including opposing first and second sides 513, 515, with multiple anodes 521A-521D arranged along a first surface of the substrate 510 proximate to the first side 513 and with multiple cathodes 522A-522D arranged on the first surface proximate to the opposing second side 515. A second surface of the substrate 510 may include solid state emitter (e.g., LED) chips 550A-550D arranged on a mounting region 540 (optionally arranged on a second surface of the substrate 510). Electrical communication with the LED chips 550A-550D may be provided with electrical traces 541A-541D, 542A-542D patterned on or over the substrate 510 and optional wirebonds 552. Electrically conductive vias (not shown) extending through the substrate 510 may be provided if the solid state emitter chips 550A-550D are arranged on an opposite surface of the substrate 510 from any of the anodes 521A-521D or the cathodes 522A-522D. Each emitter chip 550A-550D may be independently controlled using the anodes 521A-521D or the cathodes 522A-522D, preferably with one anode/cathode pair per emitter chip 550A-550D.

FIG. 6 is a schematic diagram illustrating a solid state emitter device 600 including multiple anodes 621A-621D and multiple cathodes 622A-622D arranged to permit independent control of multiple solid state emitters 650A-650D, with electrostatic discharge protection elements 655A-655D arranged in parallel (with reverse bias) with the solid state emitters (e.g., LEDs) 650A-650D on or over an insulating substrate 610. The solid state emitters 650A-650D may be arranged on one surface (e.g., top surface) 611 of the lighting device 600, with the multiple anodes 621A-621D and multiple cathodes 622A-622D optionally but preferably arranged on an opposing surface (e.g., back surface) of the lighting device 600. Examples of desirable electrostatic discharge protection elements 655A-655D include, but are not limited to, vertical silicon (Si) Zener diodes, different LEDs arranged in parallel and reverse biased to the LEDs 650A-650D, surface mount varistors and lateral Si diodes. The electrostatic discharge protection elements 655A-655D may be relatively small so as to not cover an excessive area of a light reflecting (e.g., top) face of the device 600 or block a significant amount of light emitted from the LEDs 650A-650D. Alternatively, the electrostatic discharge protection elements 655A-655D may be positioned close to an edge of a lens or implanted into a substrate to reduce or eliminate blockage of light by the electrostatic discharge protection elements 655A-655D.

FIGS. 7A-7E illustrate multi-emitter lighting devices with various arrangements of multiple anode and cathode pairs that may be used to independently control at least some emitters of the respective lighting devices. FIGS. 7A-7D illustrate various quadrant-specific configurations (i.e., with one anode/cathode pair arranged in each of four quadrants of a substrate), whereas FIG. 7E illustrates a configuration with all anodes proximate to one side wall and all quadrants proximate to an opposing side wall. Although various exemplary device configurations (including anode/cathode pair configurations) are shown in FIGS. 7A-7E, it is to be appreciated that the invention is not necessary limited to any specific configuration as shown, and that substrates of multi-chip lighting emitting devices need not be rectangular in shape (e.g., alternative devices may be round, polygonal, trapezoidal, etc.).

FIG. 7A illustrates a lighting device 710 including four anodes 711A-711D and four cathodes 712A-712B arranged in four anode/cathode pairs 713A-713B on a surface 718 (e.g., rear surface), of the device 710 with each anode/cathode pair 713A-713D being suitable for controlling at least one different solid state emitter (not shown) associated with the lighting device 710. As shown in FIG. 7A, two anode/cathode pairs 713A, 713C are arranged proximate to a first side wall 714 of the lighting device 710, and two additional anode/cathode pairs 713B, 713D are proximate to a second side wall 716 that opposes the first side wall 714. The device 710 is symmetric with respect to the anode/cathode pairs 713A-713D if rotated 180 degrees, but each anode/cathode pair 713A, 713C proximate to the first side wall 714 is arranged with opposite polarity relative to each anode/cathode pair 713B, 713D proximate to the opposing second side wall 716, with the two anodes 711A, 711D and two cathodes 712B, 712C being proximate to the four corners of the device 720.

FIG. 7B illustrates a lighting device 720 including four anodes 721A-721D and four cathodes 722A-722B arranged in four anode/cathode pairs 723A-723B on a surface 728 (e.g., rear surface), of the device 720 with each anode/cathode pair 723A-723D being suitable for controlling at least one different solid state emitter (not shown) associated with the lighting device 720. As shown in FIG. 7B, two anode/cathode pairs 723A, 723C are arranged proximate to a first side wall 724 of the lighting device 720, and two additional anode/cathode pairs 723B, 723D are proximate to a second side wall 726 that opposes the first side wall 724. The device 720 is not symmetric with respect to the anode/cathode pairs 723A-723D if rotated 180 degrees, but the device 720 is laterally symmetric with respect to the first and second side walls 724, 726, with each anode/cathode pair 723A, 723C proximate to the first side wall 724 having the same polarity as the corresponding anode/cathode pair 723B, 723D proximate to the opposing second side wall 726, and with the two anodes 721A, 721B and two cathodes 722C, 722C being proximate to the four corners of the device 720.

FIG. 7C illustrates a lighting device 730 including four anodes 731A-731D and four cathodes 732A-732B arranged in four anode/cathode pairs 733A-733B on a surface 738 (e.g., rear surface), of the device 730 with each anode/cathode pair 733A-733D being suitable for controlling at least one different solid state emitter (not shown) associated with the lighting device 730. As shown in FIG. 7C, two anode/cathode pairs 733A, 733C are arranged proximate to a first side wall 734 of the lighting device 730, and two additional anode/cathode pairs 733B, 733D are proximate to a second side wall 736 that opposes the first side wall 734. The device 730 is symmetric with respect to the anode/cathode pairs 733A-733D if rotated 180 degrees, and is also laterally symmetric with respect to the first and second side walls 734, 736, with each anode/cathode pair 733A, 733C proximate to the first side wall 734 having the same polarity as the corresponding anode/cathode pair 733B, 733D proximate to the opposing second side wall 736 with anodes 731A-731D disposed proximate to corners of the device 730, and with cathodes 732A-732D disposed inboard from the anodes 731A-731D relative to corners of the device 730.

FIG. 7D illustrates a lighting device 740 including four anodes 741A-741D and four cathodes 742A-742B arranged in four anode/cathode pairs 743A-743B on a surface 748 (e.g., rear surface), of the device 740 with each anode/cathode pair 743A-743D being suitable for controlling at least one different solid state emitter (not shown) associated with the lighting device 740. As shown in FIG. 7D, two anode/cathode pairs 743A, 743C are arranged proximate to a first side wall 744 of the lighting device 740, and two additional anode/cathode pairs 743B, 743D are proximate to a second side wall 746 that opposes the first side wall 744. The device 740 is symmetric with respect to the anode/cathode pairs 743A-743D if rotated 180 degrees, and is also laterally symmetric with respect to the first and second side walls 744, 746, with each anode/cathode pair 743A, 743C proximate to the first side wall 744 having the same polarity as the corresponding anode/cathode pair 743B, 743D proximate to the opposing second side wall 746 with anodes 741A-741D disposed proximate to corners of the device 740, and with anodes 741A-741D disposed inboard from the cathodes 742A-742D relative to corners of the device 740.

FIG. 7E illustrates a lighting device 750 including four anodes 751A-751D and four cathodes 752A-752B arranged in four anode/cathode pairs 753A-753B on a surface 758 (e.g., rear surface), of the device 750 with each anode/cathode pair 753A-753D being suitable for controlling at least one different solid state emitter (not shown) associated with the lighting device 750. As shown in FIG. 7E, all four anodes 751A-751D are arranged proximate to a first side wall 754 of the lighting device 750, and all four cathodes 752A-752D are arranged proximate to a second side wall 756 that opposes the first side wall 754.

In certain embodiments, multiple multi-chip solid state emitter devices (e.g., multi-chip emitter packages) may be disposed in a one-dimensional or two-dimensional array.

FIG. 8 illustrates a lighting device 890 including an array of solid state emitter packages 800A-800I arranged on a mounting plate or support 891 according to one embodiment. Each solid state emitter package 800A-800I preferably includes multiple individually controllable solid state emitter chips (e.g., LED chips). In certain embodiments, at least some solid state emitters of certain emitter packages of the device 890 are in conductive electrical communication (e.g., in series or in parallel) with least some other solid state emitters of other emitter packages of the device 890. In certain embodiments, each solid state emitter package 800A-800I includes multiple solid state light emitters mounted on or over a top surface of an insulating substrate, and multiple anodes and multiple cathodes along a bottom surface of the substrate and permitting independent control of at least some emitters of the multiple solid state emitters, with each emitter package 800A-800I being devoid of any anode or cathode arranged on, or extending laterally beyond, any side wall of the emitter package. One benefit of providing anodes and cathodes exclusively along bottom surface of each emitter package 800A-800I is that lateral spacing between adjacent emitter packages 800A-800I may be reduced without electrical interference. In certain embodiments, lateral spacing between side walls of adjacent emitter packages as described herein and positioned in an array is less than 2 mm, less than 1 mm, less than 0.5 mm, less than 0.25 mm, less than 0.1 mm, or zero (i.e., with side walls of adjacent emitter packages contacting one another, such as along two, three, or four sides). Any other suitable spacing between emitter packages (such as may be dictated by heat dissipation requirements) may be used. Although a 3×3 two-dimensional array of solid state emitter packages 800A-800I is illustrated in FIG. 8, it is to be appreciated that one- or two-dimensional arrays of any desired number and configuration of solid state emitter packages may be provided. One or more control elements (not shown) may be associated with the mounting plate or support 891 and used to separately control at least some of the solid state emitters contained in the arrayed emitter packages 800A-800I of the lighting device 890.

FIG. 9 illustrates a light fixture 995 according to at least one embodiment of the present invention. The light fixture 995 includes a mounting plate 975 to which multiple solid state multi-emitter lamps 970-1 to 970-6 are attached. In certain embodiments, at least some lamps 970-1 to 970-6 may embody multi-chip solid state lamps such as multi-chip LED packages. Although the mounting plate 975 is illustrated as having a circular shape, the mounting plate 975 may be provided in any suitable shape or configuration (including non-planar and curvilinear configurations). As used herein, the term "multi-chip solid state lamp" refers to a lamp including at least two solid state emitter chips (e.g., LED chips). Different solid state emitter chips within a single multi-chip solid state emitter lamp may be configured to emit the same or different colors (e.g., wavelengths) of light, including combinations of lamps and colors as disclosed previously herein. With specific reference to the first solid state lamp 970-1, each solid state lamp 970-1 to 970-6 may include multiple solid state emitters (e.g., LEDs) 964A-964D preferably arranged on a substrate or submount 961. Although FIG. 9 illustrates four solid state emitter chips as being associated with each multi-chip solid state lamp 970-1 to 970-6, it is to be appreciated that any suitable number of solid state emitter chips may be associated with each multi-chip solid state lamp 970-1 to 970-6, and the number of solid state emitter chips associated with different (e.g., multi-chip) solid state emitter lamps may be different. Each solid state lamp in a single fixture 995 may be substantially identical to one another, or solid state lamps with different output characteristics (e.g., different colors, chromaticities, etc.) may be intentionally provided in a single fixture 995.

The solid state lamps 970-1 to 970-6 may be grouped on the mounting plate 975 in clusters or other arrangements so that the light fixture 995 outputs a desired pattern of light. In certain embodiments, at least one state emitter lamp associated with a single fixture 995 includes at least one luminphor-converted light emitting component (e.g., BSY emitter) arranged to stimulate a conversion material (optionally being spatially segregated from one or more LEDs arranged to stimulate emissions from the conversion material) and may include at least one supplemental electrically activated solid state emitter. Such lamp may be devoid of emitters arranged to emit other wavelengths, or may be supplemented with one or more additional solid state emitters and/or wavelength conversion materials arranged to emit light with peak wavelengths other than those provided by the foregoing solid state emitters and wavelength conversion materials. In one embodiment, one or more of the multi-chip solid state lamps is configured to emit light having a spectral distribution including at least four color peaks (i.e., having local peak wavelengths in wavelength ranges corresponding to at least four different colors of light) to provide white light as aggregated output. Various other combinations of solid state emitters and wavelength conversion materials may be embodied in multi-chip emitter lamps (e.g., solid state emitter packages), such as disclosed previously herein.

With continued reference to FIG. 9, the light fixture 995 includes a control circuit 980 that is configured to operate the lamps 970-1 to 970-6 by independently applying drive currents to one at least one individual electrically activated solid state light emitting chip 964A-964D associated with each lamp 970-1 to 970-6. Where multiple solid state chips are provided in each lamp, each solid state chip 964A-964D in each lamp 970-1 to 970-6 may be configured to be individually addressed by the control circuit 980. In one embodiment, the control circuit 980 may include a current supply circuit configured to independently apply an on-state drive current to each individual solid state chip responsive to a control signal, and may include one or more control elements configured to selectively provide control signals to the current supply circuit. As solid state emitters (e.g., LEDs) are current-controlled devices, the intensity of the light emitted from an electrically activated solid state emitter (e.g., LED) is related to the amount of current with which the device is driven. A common method for controlling the current driven through an LED to achieve desired intensity and/or color mixing is a Pulse Width Modulation (PWM) scheme, which alternately pulses the LEDs to a full current "ON" state followed by a zero current "OFF" state. The control circuit 980 may be configured to control the current driven through the solid state emitter chips 964A-604D associated with the lamps 970-1 to 970-6 using one or more control schemes known in the art. The control circuit 980 may be attached to an opposite or back surface of the mounting plate 975, or may be provided in an enclosure or other structure (not shown) that is segregated from the lighting device 995.

While not illustrated in FIG. 9, the light fixture 995 a may further include one or more heat spreading components and/or heatsinks for spreading and/or removing heat emitted by solid state emitter chips 964A-964D associated with the lamps 970-1 to 970-6. For example, a heat spreading component may include a sheet of thermally conductive material configured to conduct heat generated by the solid state emitter chips 964A-964D of the light fixture 995 and spread the conducted heat over the area of the mounting plate 975 to reduce thermal stratification in the light fixture 995. A heat spreading component may be embodied in a solid material, a honeycomb or other mesh material, an anisotropic thermally conductive material (e.g., graphite), and/or other materials or configurations.

The light fixture 995 may further include at least one sensor (not shown) arranged to sense electrical, optical, and/or thermal properties and/or environmental conditions, and the control element 980 may be configured to selectively provide one or more control signals to at least one current supply circuit responsive to one or more output signals from at least one sensor.

Certain embodiments of the invention are directed to methods for illuminating an object, a space, or an environment, utilizing at least one lighting device as described herein. Such a method may include adjusting supply of power the at least a first LED and at least a second LED (or any other suitable numbers or groups of LEDs) to adjust any of chromaticity and color temperature (or intensity) of aggregate light emissions from the lighting device.

Embodiments as disclosed herein may provide one or more of the following beneficial technical effects: improved color rendering over a range of correlative color temperatures; reduced size; enhanced configuration flexibility; increased density of emitter arrays; and enhanced luminous intensity (particularly in array configuration), thereby permitting a lighting device (e.g., LED lighting device) to be tailored to a selected end use.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Various combinations and sub-combinations of the structures described herein are contemplated and will be apparent to a skilled person having knowledge of this disclosure. Any of the various features and elements as disclosed herein may be combined with one or more other disclosed features and elements unless indicated to the contrary herein. Correspondingly, the invention as hereinafter claimed is intended to be broadly construed and interpreted, as including all such variations, modifications and alternative embodiments, within its scope and including equivalents of the claims.

What is claimed is:

1. A light emitting diode (LED) device comprising:
a substrate comprising insulating material and including a top surface, a bottom surface, and a plurality of side walls extending between the top surface and the bottom surface;
a plurality of LEDs mounted on or over the top surface; and
a plurality of anodes and a plurality of cathodes arranged on the bottom surface and in conductive electrical communication with the plurality of LEDs;
wherein at least a first LED of the plurality of LEDs is in conductive electrical communication with a first anode of the plurality of anodes and with a first cathode of the plurality of cathodes; wherein at least a second LED of the plurality of LEDs is in conductive electrical communication with a second anode of the plurality of anodes and with a second cathode of the plurality of cathodes; and
wherein the LED device is devoid of any anode or cathode arranged on, or extending laterally beyond, any side wall of the LED device.

2. A LED device according to claim 1, further comprising a plurality of electrically conductive vias defined in the substrate between the top surface and the bottom surface, wherein each via of the plurality of electrically conductive vias is in conductive electrical communication with (i) at least one LED of the plurality of LEDs, and (ii) either a different anode of the plurality of anodes or a different cathode of the plurality of cathodes.

3. A LED device according to claim 1, further comprising a plurality of electrically conductive die attach pads arranged between the plurality of LEDs and the top surface.

4. A LED device according to claim 1, further comprising a unitary lens arranged over the plurality of LEDs.

5. A LED device according to claim 1, wherein the at least a first LED comprises at least one LED comprising a peak wavelength in a range of from 430 nm to 480 nm and arranged to stimulate at least one lumiphor comprising a peak wavelength in a range of from 500 nm to 560 nm, and the at least a second LED comprises at least one LED comprising a peak wavelength in a range of from 600 nm to 660 nm.

6. A LED device according to claim 1, comprising at least one of the following features (i) or (ii): (i) the at least a first LED comprises a plurality of first LEDs; or (ii) the at least a second LED comprises a plurality of second LEDs.

7. A LED device according to claim 1, wherein:
the at least a first LED comprises a first blue LED arranged to stimulate emissions of a first yellow lumiphor disposed on the first blue LED;
the at least a second LED comprises a second blue LED arranged to stimulate emissions of a second yellow lumiphor disposed on the second blue LED; and
at least a third LED of the plurality of LEDs comprises a red LED and is in conductive electrical communication with a third anode of the plurality of anodes and with a third cathode of the plurality of cathodes.

8. A LED device according to claim 1, wherein:
at least a third LED of the plurality of LEDs is in conductive electrical communication with a third anode of the plurality of anodes and with a third cathode of the plurality of cathodes;
the at least a first LED includes a first LED comprising a first peak wavelength;
the at least a second LED includes a second LED comprising a second peak wavelength;
the at least a third LED includes a third LED comprising a third peak wavelength;
the first peak wavelength is within 20 nm of the second peak wavelength; and
the third peak wavelength differs from each of the first peak wavelength and the second peak wavelength by at least 40 nm.

9. A LED device according to claim 1, wherein:
the at least a first LED comprises a first red LED;
the at least a second LED comprises a second green LED;
at least a third LED of the plurality of LEDs comprises a third blue LED and is in conductive electrical communication with a third anode of the plurality of anodes and with a third cathode of the plurality of cathodes; and
at least a fourth LED of the plurality of LEDs comprises a fourth blue LED arranged to stimulate emissions of a yellow lumiphor disposed on or over the fourth blue LED, wherein the fourth blue LED is in conductive electrical communication with a fourth anode of the plurality of anodes and with a fourth cathode of the plurality of cathodes.

10. A light emitting diode (LED) device comprising:
a substrate comprising insulating material and including a top surface, a bottom surface, and a plurality of side walls extending between the top surface and the bottom surface;
a plurality of die attach pads patterned in or on the top surface;
a plurality of LEDs mounted to the plurality of die attach pads; and
a plurality of electrically conductive vias defined in the substrate between the top surface and the bottom surface;
wherein at least a first LED of the plurality of LEDs is in conductive electrical communication with a first pair of vias of the plurality of electrically conductive vias;
wherein at least a second LED of the plurality of LEDs is in conductive electrical communication with a second pair of vias of the plurality of electrically conductive vias that differs from the first pair of vias; and
wherein the LED device is devoid of any anode or cathode arranged on, or extending laterally beyond, any side wall of the LED device.

11. A LED device according to claim 10, comprising a plurality of anodes and a plurality of cathodes arranged on the bottom surface and in conductive electrical communication with the plurality of electrically conductive vias, wherein the plurality of anodes and the plurality of cathodes includes (i) a first anode/cathode pair in conductive electrical communication with the first pair of vias, and (ii) a second anode/cathode pair in conductive electrical communication with the second pair of vias.

12. A LED device according to claim 11, wherein the at least a first LED and the at least a second LED are independently controllable using the first anode/cathode pair and the second anode/cathode pair.

13. A LED device according to claim 10, wherein:
the at least a first LED comprises a first blue LED arranged to stimulate emissions of a first yellow lumiphor disposed on the first blue LED;
the at least a second LED comprises a second blue LED arranged to stimulate emissions of a second yellow lumiphor disposed on the second blue LED; and
the plurality of LEDs includes at least a third LED, and the at least a third LED comprises a red LED.

14. A light emitting diode (LED) device comprising:
a plurality of LEDs mounted on or over a top surface of a substrate that comprises a ceramic material, a bottom surface, and a plurality of side walls extending between the top surface and the bottom surface;
a molded lens arranged over the plurality of LEDs and arranged to transmit light generated by the plurality of LEDs; and
a plurality of anodes and a plurality of cathodes arranged on the bottom surface and in conductive electrical communication with the plurality of LEDs, wherein the plurality of anodes includes a first anode and a second anode, and the plurality of cathodes includes a first cathode and a second cathode;
wherein at least two LEDs of the plurality of LEDs are independently controllable using the plurality of anodes and the plurality of cathodes; and
wherein the LED device is devoid of any anode or cathode arranged on, or extending laterally beyond, any side wall of the LED device.

15. A LED device according to claim 14, further comprising a plurality of electrically conductive vias defined in the substrate between the top surface and the bottom surface, wherein each via of the plurality of electrically conductive vias is in conductive electrical communication with (i) at least one LED of the plurality of LEDs, and (ii) either a different anode of the plurality of anodes or a different cathode of the plurality of cathodes.

16. A LED device according to claim 14, wherein at least three LEDs of the plurality of LEDs are independently controllable using the plurality of anodes and the plurality of cathodes, and wherein the at least three LEDs comprise:
a first blue LED arranged to stimulate emissions of a first yellow lumiphor disposed on the first blue LED;
a second blue LED arranged to stimulate emissions of a second yellow lumiphor disposed on the second blue LED; and
a third red LED.

17. A LED device according to claim 14, wherein:
at least three LEDs of the plurality of LEDs are independently controllable using the plurality of anodes and the plurality of cathodes;
the at least three LEDs include a first LED comprising a first peak wavelength, a second LED comprising a second peak wavelength, and a third LED comprising a third peak wavelength;
the first peak wavelength is within 20 nm of the second peak wavelength; and the third peak wavelength differs from each of the first peak wavelength and the second peak wavelength by at least 40 nm.

18. A LED device according to claim 14, wherein:
at least four LEDs of the plurality of LEDs are independently controllable using the plurality of anodes and the plurality of cathodes;
the at least four LEDs include a first red LED, a second green LED, a third blue LED, and a fourth blue LED; and
the fourth blue LED is arranged to stimulate emissions of a yellow lumiphor disposed on the fourth blue LED.

19. A light emitting diode (LED) device comprising:
a substrate comprising insulating material, including a top surface, a bottom surface, a plurality of side walls extending between the top surface and the bottom surface, and a plurality of conductive traces patterned on or over the top surface;
a plurality of LEDs mounted on or over the top surface and in conductive electrical communication with the plurality of conductive traces, wherein the plurality of LEDs comprises (i) a first blue LED arranged to stimulate emissions of a first yellow lumiphor disposed on the first blue LED, (ii) a second blue LED arranged to stimulate emissions of a second yellow lumiphor disposed on the second blue LED, and (iii) a red LED; and
a plurality of anodes and a plurality of cathodes arranged on the bottom surface and in conductive electrical communication with the plurality of conductive traces and the plurality of LEDs, wherein the plurality of anodes includes a first anode and a second anode, and the plurality of cathodes includes a first cathode and a second cathode;
wherein each of the first blue LED, the second blue LED, and the red LED is independently controllable; and
wherein the LED device is devoid of any anode or cathode arranged on, or extending laterally beyond, any side wall of the LED device.

20. A LED device according to claim 19, further comprising a plurality of electrically conductive vias defined in the substrate between the top surface and the bottom surface, wherein each via of the plurality of electrically conductive vias is in conductive electrical communication with (i) at least one LED of the plurality of LEDs, and (ii) either a different anode of the plurality of anodes or a different cathode of the plurality of cathodes.

21. A light emitting diode (LED) device comprising:
a substrate comprising insulating material, including a top surface, a bottom surface, a plurality of side walls extending between the top surface and the bottom surface, and a plurality of conductive traces patterned on or over the top surface;
a plurality of LEDs mounted on or over the top surface and in conductive electrical communication with the plurality of conductive traces, wherein the plurality of LEDs comprises a first LED comprising a first peak wavelength, a second LED comprising a second peak wavelength, and a third LED comprising a third peak wavelength; and
a plurality of anodes and a plurality of cathodes arranged on the bottom surface and in conductive electrical communication with the plurality of conductive traces and the plurality of LEDs, wherein the plurality of anodes includes a first anode and a second anode, and the plurality of cathodes includes a first cathode and a second cathode;
wherein each of the first LED, the second LED, and the third LED is independently controllable;
wherein the first peak wavelength is within 20 nm of the second peak wavelength;
wherein the third peak wavelength differs from each of the first peak wavelength and the second peak wavelength by at least 40 nm; and
wherein the LED device is devoid of any anode or cathode arranged on, or extending laterally beyond, any side wall of the LED device.

22. A LED device according to claim 21, further comprising a plurality of electrically conductive vias defined in the substrate between the top surface and the bottom surface, wherein each via of the plurality of electrically conductive vias is in conductive electrical communication with (i) at least one LED of the plurality of LEDs, and (ii) either a different anode of the plurality of anodes or a different cathode of the plurality of cathodes.

23. A LED device according to claim 21, wherein:
the first LED comprises a first blue LED arranged to stimulate emissions of a first yellow lumiphor disposed on the first blue LED;
the second LED comprises a second blue LED arranged to stimulate emissions of a second yellow lumiphor disposed on the second blue LED; and
the third LED comprises a red LED.

24. A LED device according to claim 21, wherein the first peak wavelength is within 5 nm of the second peak wavelength.

25. A LED device according to claim 1, comprising a plurality of electrostatic discharge protection elements, wherein each electrostatic discharge protection element of the plurality of electrostatic discharge protection elements is in conductive electrical communication with a different anode of the plurality of anodes and is in conductive electrical communication with a different cathode of the plurality of cathodes.

26. A LED device according to claim 1, wherein the plurality of side walls includes opposing first and second side walls, wherein the first anode and the first cathode are arranged proximate to the first side wall, and the second anode and the second cathode are arranged proximate to the second side wall.

27. A LED device according to claim 10, comprising a plurality of electrostatic discharge protection elements, wherein a first electrostatic discharge protection element of the plurality of electrostatic discharge protection elements is in conductive electrical communication with the first pair of vias, and a second electrostatic discharge protection element of the plurality of electrostatic discharge protection elements is in conductive electrical communication with the second pair of vias.

28. A LED device according to claim 10, wherein the plurality of side walls includes opposing first and second side walls, wherein a first anode and a first cathode are arranged proximate to the first side wall and are in conductive electrical communication with the first pair of vias, and a second anode and a second cathode are arranged proximate to the second side wall and are in conductive electrical communication with the second pair of vias.

29. A LED device according to claim 14, comprising a plurality of electrostatic discharge protection elements, wherein each electrostatic discharge protection element of the plurality of electrostatic discharge protection elements is in conductive electrical communication with a different anode of the plurality of anodes and with a different cathode of the plurality of cathodes.

30. A LED device according to claim 14, wherein the plurality of side walls includes opposing first and second side walls, wherein the first anode and the first cathode are arranged proximate to the first side wall and in conductive electrical communication with a first LED of the plurality of LEDs, and the second anode and the second cathode are arranged proximate to the second side wall and in conductive electrical communication with a second LED of the plurality of LEDs.

31. A LED device according to claim 19, comprising a plurality of electrostatic discharge protection elements, wherein each electrostatic discharge protection element of the plurality of electrostatic discharge protection elements is in conductive electrical communication with a different anode of the plurality of anodes and is in conductive electrical communication with a different cathode of the plurality of cathodes.

32. A LED device according to claim 19, wherein the plurality of side walls includes opposing first and second side walls, wherein the first anode and the first cathode are arranged proximate to the first side wall and in conductive electrical communication with one of the first blue LED, the second blue LED, or the red LED; and the second anode and the second cathode are arranged proximate to the second side wall and in conductive electrical communication with a different one of the first blue LED, the second blue LED, or the red LED.

33. A LED device according to claim 21, comprising a plurality of electrostatic discharge protection elements, wherein each electrostatic discharge protection element of the plurality of electrostatic discharge protection elements is in conductive electrical communication with a different anode of the plurality of anodes and is in conductive electrical communication with a different cathode of the plurality of cathodes.

34. A LED device according to claim 21, wherein the plurality of side walls includes opposing first and second side walls, wherein the first anode and the first cathode are arranged proximate to the first side wall and in conductive electrical communication with one of the first LED, the second LED, or the third LED; and the second anode and the second cathode are arranged proximate to the second side wall and in conductive electrical communication with a different one of the first LED, the second LED, or the third LED.

* * * * *

UNITED STATES PATENT AND TRADEMARK OFFICE
CERTIFICATE OF CORRECTION

| | |
|---|---|
| PATENT NO. | : 9,515,055 B2 |
| APPLICATION NO. | : 13/471164 |
| DATED | : December 6, 2016 |
| INVENTOR(S) | : Jeffrey Carl Britt, Michael P. Laughner and Brandon Stanton |

It is certified that error appears in the above-identified patent and that said Letters Patent is hereby corrected as shown below:

On the Title Page

Below abstract delete "34 Claims, 12 Drawing Sheets" and insert --36 Claims, 12 Drawing Sheets--

In the Claims

At Column 36, Line 23, please insert the following Claims 35 and 36:

--35. A LED device according to claim 10, wherein:
    the at least a first LED includes a first LED comprising a first peak wavelength;
    the at least a second LED includes a second LED comprising a second peak wavelength;
    the plurality of LEDs includes at least a third LED comprising a third peak wavelength;
    the first peak wavelength is within 20 nm of the second peak wavelength; and
    the third peak wavelength differs from each of the first peak wavelength and the second peak wavelength by at least 40 nm.

36. A LED device according to claim 10, wherein:
    at least a third LED of the plurality of LEDs is in conductive electrical communication with a third pair of vias of the plurality of electrically conductive vias that differs from the first pair of vias and from the second pair of vias;
    at least a fourth LED of the plurality of LEDs is in conductive electrical communication with a fourth pair of vias of the plurality of electrically conductive vias that differs from the first pair of vias, the second pair of vias, and the third pair of vias;
    the at least a first LED comprises a first red LED;
    the at least a second LED comprises a second green LED;
    the at least a third LED comprises a third blue LED; and
    the at least a fourth LED comprises a fourth blue LED, wherein the fourth blue LED is arranged to stimulate emissions of a yellow lumiphor disposed on the fourth blue LED.--

Signed and Sealed this
Twenty-sixth Day of September, 2017

Joseph Matal
*Performing the Functions and Duties of the
Under Secretary of Commerce for Intellectual Property and
Director of the United States Patent and Trademark Office*